United States Patent
Mohammed et al.

(10) Patent No.: US 12,100,679 B2
(45) Date of Patent: Sep. 24, 2024

(54) MULTI-PIN-WAFER-LEVEL-CHIP-SCALE-PACKAGING SOLUTION FOR HIGH POWER SEMICONDUCTOR DEVICES

(71) Applicant: Dialog Semiconductor (UK) Limited, London (GB)

(72) Inventors: Habeeb Mohiuddin Mohammed, Weilhelm an der Teck (DE); Rajesh Subraya Aiyandra, Denkendorf (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 17/967,472

(22) Filed: Oct. 17, 2022

(65) Prior Publication Data
US 2023/0077469 A1    Mar. 16, 2023

Related U.S. Application Data

(62) Division of application No. 16/995,697, filed on Aug. 17, 2020, now Pat. No. 11,495,567, which is a
(Continued)

(51) Int. Cl.
*H01L 23/31*    (2006.01)
*H01L 23/00*    (2006.01)

(52) U.S. Cl.
CPC .......... *H01L 24/14* (2013.01); *H01L 23/3192* (2013.01); *H01L 24/03* (2013.01);
(Continued)

(58) Field of Classification Search
CPC ....... H01L 2924/00014; H01L 2924/00; H01L 2224/94; H01L 2224/97
See application file for complete search history.

(56) References Cited

U.S. PATENT DOCUMENTS

| 6,930,032 B2 | 8/2005 | Sarihan et al. |
| 8,836,094 B1 | 9/2014 | Lin et al. |

(Continued)

FOREIGN PATENT DOCUMENTS

JP    2007149828    6/2007

OTHER PUBLICATIONS

"Meeting industry demands for turnkey WLCSP products," Amkor Technology, © Copyright 2019 Amkor Technology, 2 pages, http://www.amkor.com/go/Wafer-Level-Packaging.
(Continued)

*Primary Examiner* — Tony Tran
(74) *Attorney, Agent, or Firm* — Saile Ackerman LLC; Stephen B. Ackerman; Rosemary L. S. Pike

(57) ABSTRACT

A multi-pin wafer level chip scale package is achieved. One or more solder pillars and one or more solder blocks are formed on a silicon wafer wherein the one or more solder pillars and the one or more solder blocks all have a top surface in a same horizontal plane. A pillar metal layer underlies the one or more solder pillars and electrically contacts the one or more solder pillars with the silicon wafer through an opening in a polymer layer over a passivation layer. A block metal layer underlies the one or more solder blocks and electrically contacts the one or more solder pillars with the silicon wafer through a plurality of via openings through the polymer layer over the passivation layer wherein the block metal layer is thicker than the pillar metal layer.

20 Claims, 25 Drawing Sheets

Related U.S. Application Data division of application No. 15/686,484, filed on Aug. 25, 2017, now Pat. No. 10,797,012.

(52) U.S. Cl.
CPC ............ *H01L 24/05* (2013.01); *H01L 24/11* (2013.01); *H01L 24/13* (2013.01); *H01L 23/3114* (2013.01); *H01L 2224/02311* (2013.01); *H01L 2224/02321* (2013.01); *H01L 2224/02373* (2013.01); *H01L 2224/0239* (2013.01); *H01L 2224/0345* (2013.01); *H01L 2224/0346* (2013.01); *H01L 2224/03614* (2013.01); *H01L 2224/0401* (2013.01); *H01L 2224/05005* (2013.01); *H01L 2224/05147* (2013.01); *H01L 2224/1146* (2013.01); *H01L 2224/13006* (2013.01); *H01L 2224/13017* (2013.01); *H01L 2224/13024* (2013.01); *H01L 2224/13082* (2013.01); *H01L 2224/1403* (2013.01); *H01L 2224/94* (2013.01); *H01L 2924/01029* (2013.01); *H01L 2924/20641* (2013.01); *H01L 2924/20646* (2013.01); *H01L 2924/2075* (2013.01); *H01L 2924/20752* (2013.01); *H01L 2924/30101* (2013.01); *H01L 2924/30105* (2013.01); *H01L 2924/30107* (2013.01)

(56) References Cited

U.S. PATENT DOCUMENTS

| | | | |
|---|---|---|---|
| 9,030,010 B2 * | 5/2015 | Liang | H01L 24/11 257/738 |
| 9,369,175 B2 | 6/2016 | Lee et al. | |
| 10,797,012 B2 | 10/2020 | Mohammed et al. | |
| 11,495,567 B2 | 11/2022 | Mohammed et al. | |
| 2007/0069346 A1 | 3/2007 | Lin et al. | |
| 2008/0136004 A1 | 6/2008 | Yang et al. | |
| 2010/0038803 A9 | 2/2010 | Lee et al. | |
| 2010/0155937 A1 | 6/2010 | Hsu et al. | |
| 2011/0003470 A1 | 1/2011 | Burgess et al. | |
| 2011/0248398 A1 | 10/2011 | Parvarandeh et al. | |
| 2013/0056866 A1 | 3/2013 | Samoilov | |
| 2013/0134581 A1 | 5/2013 | Lin et al. | |
| 2013/0223014 A1 | 8/2013 | Lin et al. | |
| 2014/0042615 A1 | 2/2014 | Huang et al. | |
| 2014/0061897 A1 | 3/2014 | Lin et al. | |
| 2014/0252593 A1 * | 9/2014 | Chen | H01L 24/81 257/737 |
| 2015/0008575 A1 | 1/2015 | Lin et al. | |
| 2015/0187745 A1 | 7/2015 | Chiu et al. | |
| 2017/0092575 A1 | 3/2017 | Manusharow | |

OTHER PUBLICATIONS

SMM5138XZ, 12.7-15.4GHz Up converter MMIC, Sumitomo Electric, Edition 1.3, Dec. 2012, pp. 1-16.

US Office Action, U.S. Appl. No. 15/686,484, Application: Mohammed et al., Mail date: Dec. 17, 2018, 13 pages.

US Office Action, U.S. Appl. No. 15/686,484, Application: Mohammed et al., Mail date: May 17, 2019, 13 pages.

US Office Action, U.S. Appl. No. 15/686,484, Application: Mohammed et al., Mail date: Oct. 16, 2019, 12 pages.

US Office Action, U.S. Appl. No. 15/686,484, Application: Mohammed et al., Mail date: Feb. 14, 2020, 13 pages.

US Notice of Allowance, U.S. Appl. No. 15/686,484, Application: Mohammed et al., Mail date: Jun. 8, 2020, 13 pages.

US Office Action, U.S. Appl. No. 16/995,697, Applicant: Mohammed et al., Mail date: Aug. 20, 2021, 21 pages.

US Office Action, U.S. Appl. No. 16/995,697, Applicant: Mohammed et al., Mail date: Feb. 23, 2022, 18 pages.

US Notice of Allowance, U.S. Appl. No. 16/995,697, Applicant: Mohammed et al., Mail date: Jul. 6, 2022, 7 pages.

* cited by examiner

MULTI-PIN-WAFER-LEVEL-CHIP-SCALE-PACKAGING SOLUTION FOR HIGH POWER SEMICONDUCTOR DEVICES

This is a divisional application of U.S. Ser. No. 16/995,697, filed on Aug. 17, 2020, which is a divisional application of U.S. Ser. No. 15/686,484 filed on Aug. 25, 2017, now issued as U.S. Pat. No. 10,797,012, both assigned to the same assignee as the instant application, and which are herein incorporated by reference in their entirety.

(1) TECHNICAL FIELD

This disclosure is related to wafer level chip scale packaging, and more particularly, to wafer level chip scale packaging which will support high current.

(2) BACKGROUND

Packaging of an integrated circuit is needed to protect the semiconductor, chip, die, or integrated circuit from physical damage. For example, damage could occur while connecting the chip to the application printed circuit board (PCB) or during its usage by the customer.

There exist several different packaging types on the market, for example, lead frame packages, ball grid array packages, chip scale packages, wafer level chip scale packages, etc. Among these, a wafer level chip scale package (WLCSP) has the smallest form factor (i.e. package size is the same as the die size) and good electrical, mechanical and thermal characteristics. It also has a simpler stackup than other package types. The assembly processing cost is also lower compared to some of the other packaging solutions.

Refer to FIG. 1 for a typical wafer level chip scale package. After inspecting the silicon 10 from the wafer fab, a layer 16 of polymer1 is processed. This is followed by a uniform metal sputtering—the assembly redistribution layer (RDL) 18. The thickness of the metal is uniform over the entire chip. This is then followed by the RDL metal plating 18. The thickness of this metal is uniform over the entire chip. Then a layer 20 of polymer2 is processed on the top of RDL. An under ball metal (UBM) layer 22 is first sputtered and then plated. The thickness of this UBM is uniform over the entire chip. This is followed by solder ball 24 placement. The dimensions of the solder balls placed are uniform over the entire chip.

For the standard solder ball pitch and solder ball dimensions used by the industry for the wafer level chip scale package (WLCSP), there is a limit to the current that can be passed through the solder balls. At this time, most high power application integrated circuits using WLCSP packaging technology are carrying around 1.2 to 1.5 A per solder ball. For future products, the current per package solder pin requirement might be even more. This trend of increasing the current per solder ball in WLCSPs will only increase in the future. The current per solder ball is limited by the solder ball diameter and the size of under ball metallization (UBM) underneath the solder ball.

Moreover, in the future, the industry will be moving toward WLCSP packages with smaller solder ball diameters and pitches. It will be desirable to have as many solder balls as possible without having to increase the chip area. Reducing the size of the solder balls is desirable because larger solder ball diameters for smaller pitches have had issues such as solder ball bridging. Reducing the solder-ball pitch and hence solder ball diameter/UBM diameter will limit the current per solder ball in WLCSP even more. As solder ball dimensions and solder ball pitch are reduced in the future, it will be even more difficult to pass high amounts of current through the packaging pins (here, solder balls for wafer level chip scale package). Reducing the solder ball pitch and solder ball diameter/UBM diameter will result in reduced board level reliability and reduced thermal and electrical performance.

To solve these problems, some practitioners have tried to increase the RDL/UBM thickness or change the material properties of either RDL or UBM. Some have tried to remove the RDL all together, connecting the solder ball to the UBM or to remove the UBM all together, connecting the solder ball to the RDL. However, changing the thickness of the RDL/UBM will result in degradation of board level reliability of the package and will not be able to achieve the large amounts of current needed in the industry.

U.S. Pat. No. 9,369,175 (Lee et al), U.S. Pat. No. 6,930,032 (Sarihan et al), and U.S. Pat. No. 8,836,094 (Lin et al) and U.S. Patent Applications 2015/0187745 (Chiu et al) and 2010/0038803 (Lee et al) disclose solder plating methods in chip scale packaging.

SUMMARY

It is the primary objective of the present disclosure to provide a chip scale package for high current application devices.

It is a further objective of the present disclosure to provide a chip scale package for high current application devices that will prevent electro-migration and fusing or melting of the package metal distribution layer and/or Under block Metallization (UBM) and/or Solder inter-connect when high currents are passed through them and thereby improve the reliability of the integrated circuit.

In accordance with the objectives of the present disclosure, a multi-pin wafer level chip scale package is achieved. One or more solder pillars (SP) and one or more solder blocks (SB) are formed on a silicon wafer wherein the one or more solder pillars (SP) and the one or more solder blocks (SB) all have a top surface in a same horizontal plane. A pillar metal layer [Under Pillar Metal (UPM)] underlies the one or more SPs and electrically connects the one or more SPs with the silicon wafer through an opening in a polymer layer over a passivation layer. A block metal layer [Under Block Metal (UBM)] underlies the one or more SBs and electrically connects the one or more SBs with the silicon wafer through a plurality of via openings through the polymer layer over the passivation layer wherein the block metal layer (UBM) is thicker than the pillar metal layer (UPM).

Also in accordance with the objectives of the present disclosure, a method of forming a multi-pin wafer level chip scale package is achieved. A silicon wafer is provided having a passivation layer thereon having openings therein to silicon pads on the silicon wafer. A first polymer layer is coated on the passivation layer. A metal trace (Redistribution Layer [RDL]) is formed contacting silicon pads through openings in the first polymer layer in areas where low current connections are to be made and a metal block (Redistribution Layer [RDL_VIA]) is formed over and through vias contacting the silicon pads through openings in the first polymer layer in areas where high current connections are to be made wherein the metal block (RDL_VIA) is thicker than the metal trace (RDL). A solder pillar (SP) is formed on each metal trace (RDL) and a solder block (SB) is formed on each metal block (RDL_VIA) wherein the SBs are wider than the SPs and wherein a top surface of each of the SPs and SBs are in the same horizontal plane.

The primary technical objective to be achieved is a chip scale package for high current applications in which thicker Redistribution layer (RDL_VIA), a thicker and wider Under Block Metal (UBM), and wider SB will prevent electromigration at the UBM/solder block interface and fusing of package conductor layers (UBM or RDL_VIA or Solder Block). Further technical objectives include:

Thicker and wider Under Block Metal (UBM) under the solder blocks (SB) will reduce the parasitic resistance and inductance of the electrical path and hence improve the electrical performance.

Thicker and wider UBM under the SBs will improve the thermal performance of the package and reduce the thermal resistance.

Thicker and wider UBM under the SBs will improve board level reliability of the package.

Thicker RDL_VIA for high current signals will reduce the parasitic resistance and inductance by providing the shortest current path from the silicon pads to the printed circuit board (PCB).

Thicker RDL_VIA will improve the thermal performance of the package and reduce the thermal resistance.

Solder blocks (SB of large width) will reduce parasitic resistance and inductance of the electrical path and improve electrical performance.

SBs (of large width) will improve the thermal performance of the package and reduce the thermal resistance.

Solder pillars (SP, of larger height) will improve the thermal performance of the package.

SPs (of larger height) will improve the board level reliability of the package.

BRIEF DESCRIPTION OF THE DRAWINGS

In the accompanying drawings forming a material part of this description, there is shown.

DETAILED DESCRIPTION

Figure 2A:
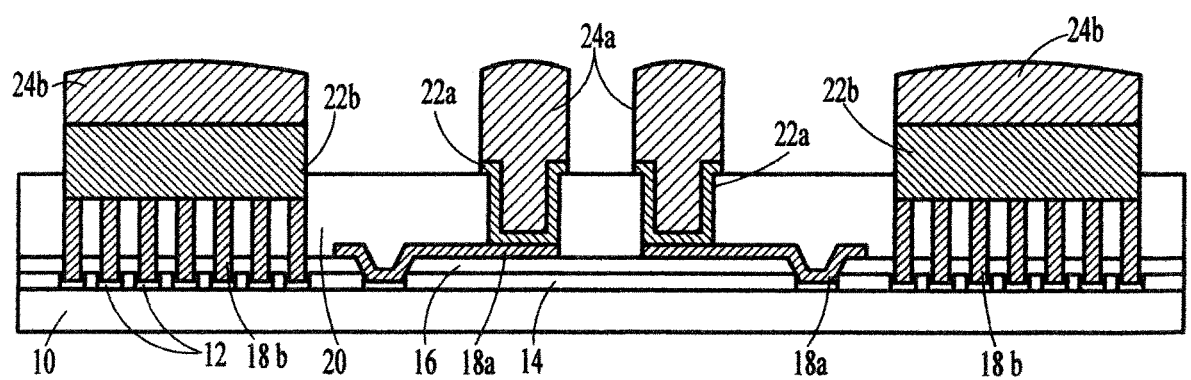
FIG. 2A is a cross-sectional representation of a MP-WLCSP in a first preferred embodiment of the present disclosure.
Figure 2B:
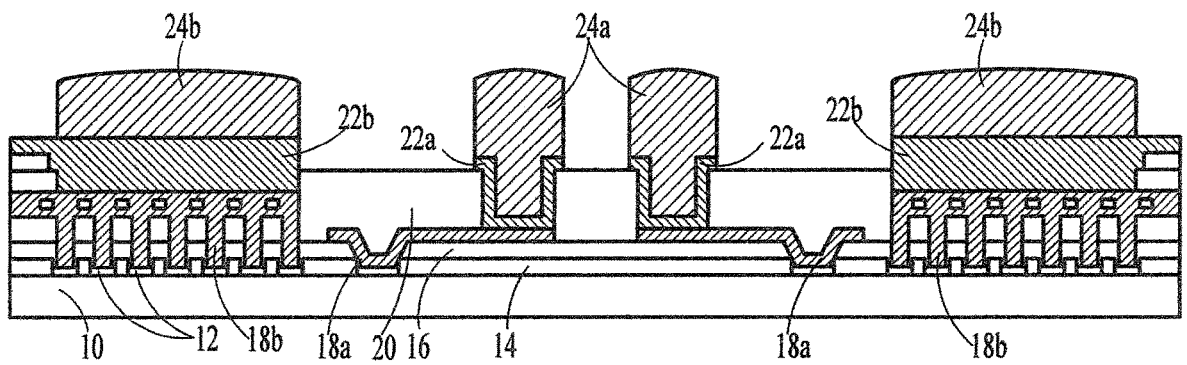
FIG. 2B is an alternative cross-sectional representation of a MP-WLCSP in a second preferred embodiment of the present disclosure.

The present disclosure presents chip scale packaging technology (WLCSP) having different material stackup and different package pins to support the future demands of the semiconductor industry in a far better way than the existing chip scale packaging technology. FIG. 2A illustrates the cross section of the present disclosure, Multi Pin WLCSP, showing the different material layers and types of solder contacts. FIG. 2B illustrates the same chip scale package fabricated using an alternative assembly processing method.

The wafer level packaging metal layer 22a and 22b (Under Pillar and Under Block Metal) have differing thicknesses and/or widths correlated with expected current density. That is, pins 24a (solder pillars) for low current units will have thinner and narrower underlying metal layer 22a (Under Pillar Metal) while pins 24b (solder blocks) for high current units will have thicker and wider underlying metal layer 22b (Under Block Metal). Low current is considered to be less than or equal to about 2 amperes (A) while high current is greater than about 2 A.

The wafer level packaging metal layer 18a and 18b (RDL traces and RDL_VIAs) have differing thicknesses and/or widths correlated with expected current density. That is, metal layer carrying low currents, 22a (Under Pillar Metal) is connected to silicon pads through thinner and narrower underlying metal distribution layer 18a (RDL traces), while high current carrying metal layer 22b (Under Block Metal) is connected to silicon pads through thicker and wider underlying metal layer 18b (RDL_VIA).

The thicker/wider Under Block Metal (UBM) 22b connected to solder block (SB) 24b and the relatively thinner/narrower Under Pillar Metal (UPM) 22a connected to Solder Pillars (SP) 24a allows for multiple solder inter-connects for packaging. There are no point contacts as would be the case with a solder ball, but the flat cylindrical or pillar shaped solder contact 24b provides a large contact area. The solder blocks 24b are plated, not bumped. The remaining solder interconnects 24a are also non-spheres. They are cylindrical or pillar shaped and plated, not bumped.

The multi-pin WLCSP of the present disclosure provides better thermal, electrical, mechanical, and board level performance than the existing WLSCP packaging. It supports a higher current and provides a better package life and quality when supporting high DC current than the existing packages. Standard industry packaging design rules are followed by the disclosed multi-pin WLCSP.

Figure 3A:
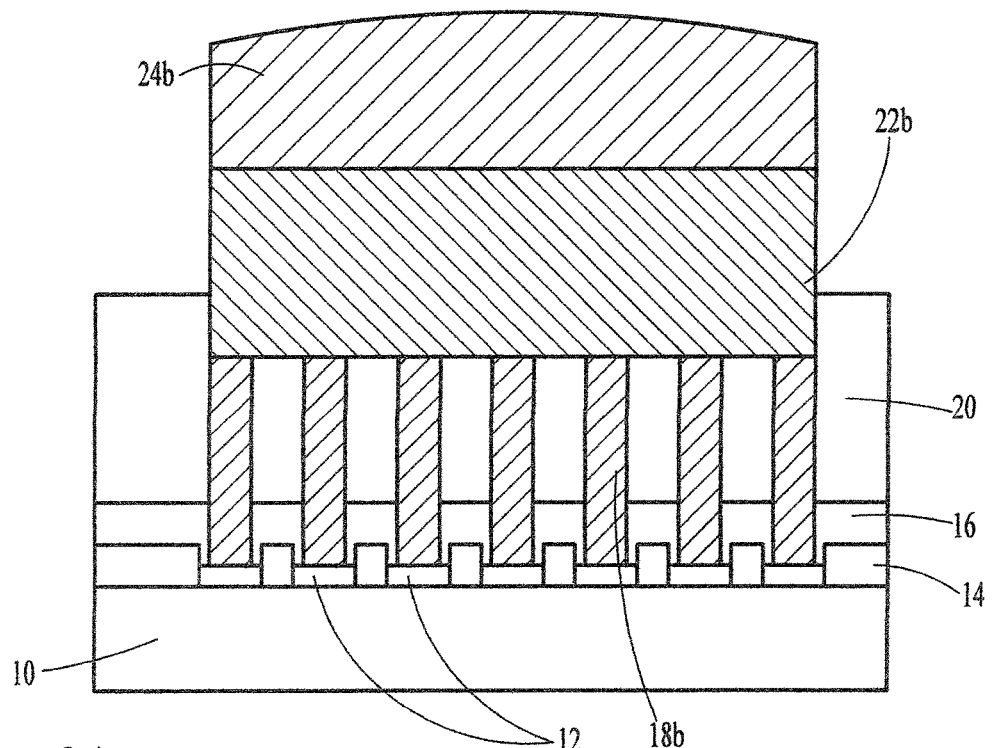
FIG. 3A is an enlarged cross-sectional representation of a portion of the MP-WLCSP of FIG. 2A in a first preferred embodiment of the present disclosure.
Figure 3B:
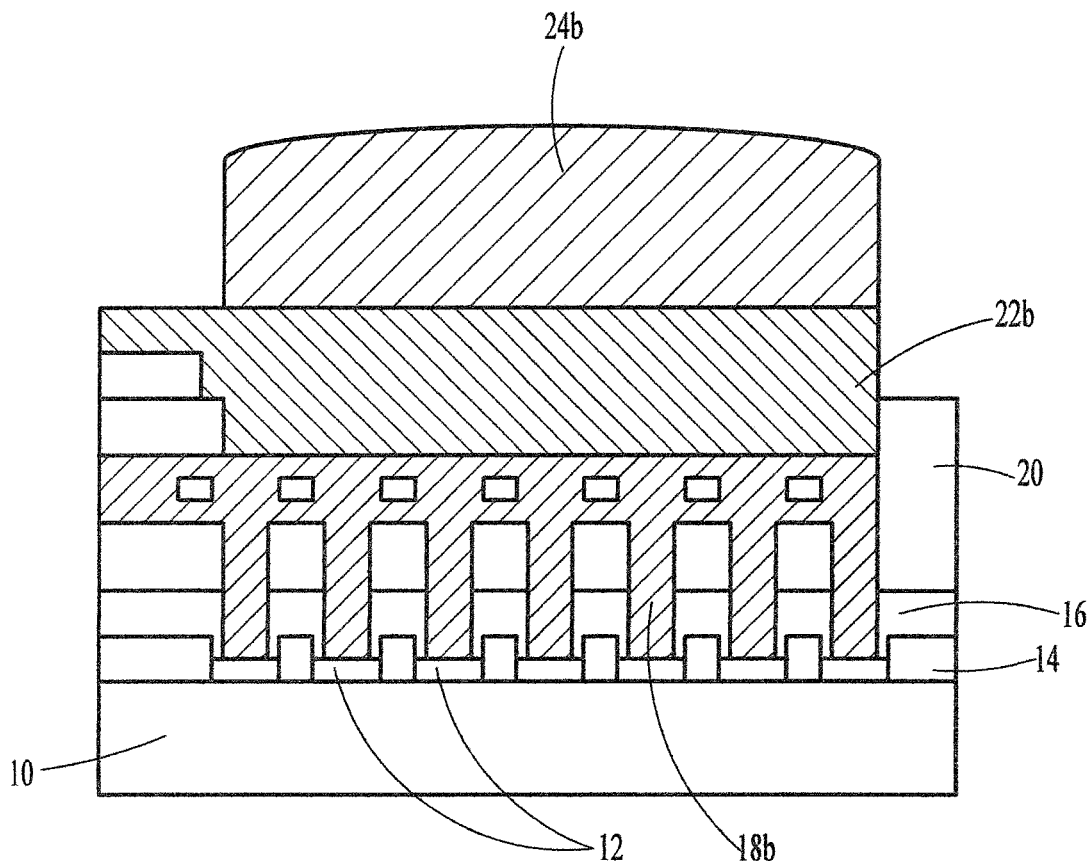
FIG. 3B is an enlarged cross-sectional representation of a portion of the MP-WLCSP of FIG. 2B in a second preferred embodiment of the present disclosure.

FIG. 3A illustrates a high current carry packaging pin and underlying structures in enlarged cross-section. In this embodiment, solder block (SB) 24b sits on top of a thick and wide under block metal (UBM) 22b. The UBM is connected to the silicon pads 12 by means of RDL_VIA 18b. The solder block and UBM are both wider than about 600 μm. FIG. 3B illustrates a similar high current carry packaging fabricated using an alternative assembly processing method.

Figure 1:
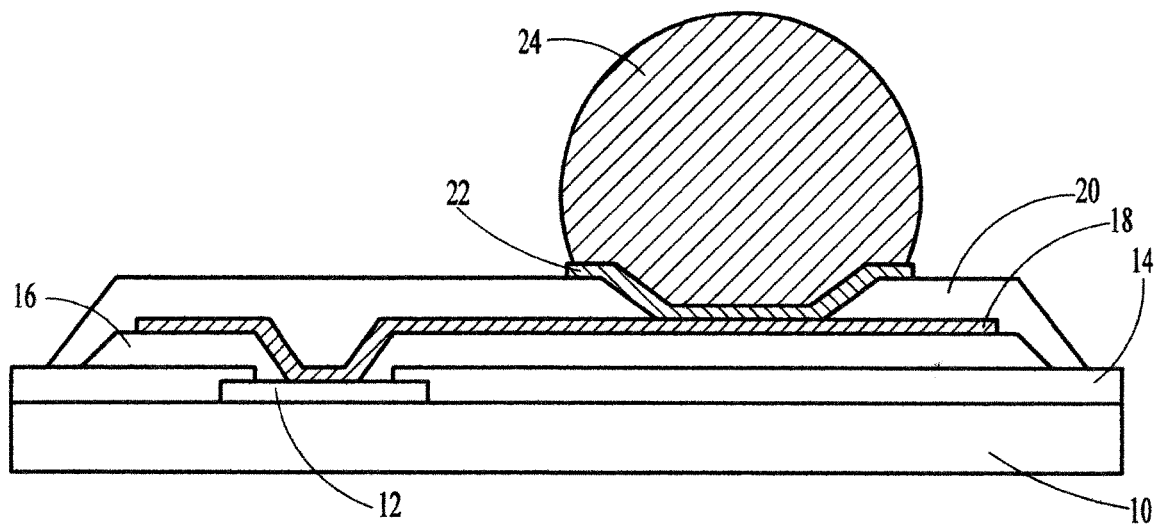
FIG. 1 is a cross-sectional representation of a wafer level chip scale package (WLCSP) of the prior art.

In standard WLCSP (Prior Art FIG. 1), electromigration occurs because of high current crowding at the Under Ball Metal (UBM) (22)/solder ball (24) interface since the cross-sectional area of the solder ball is larger than the UBM cross sectional area. In the MP-WLCSP of the present disclosure, as seen for example in FIG. 3A, the cross sectional area of the Under Block Metal (UBM) 22b is almost the same as that of the solder block 24b. The surface contact between the UBM 22b and the solder block 24b is better than UBM 22-Solder ball 24 contact in the WLCSP. This also helps in achieving higher currents by reducing the current crowding.

Table 1 (below) compares the maximum DC current values per packaging pin at three different temperatures for the typical WLCSP (column 2) and the MP-WLCSP of the present disclosure (column 3). Maximum current values for WLCSP are taken from the EM study done by an assembly supplier on a package having a 250 μm solder ball (24), 245 μm UBM (22) diameter, and 8.3 μm UBM (22) thickness. The maximum DC current values for MP-WLSCP are calculated values, given a solder block (24b) width of 1200 μm, UBM (22b) thickness of 50 μm and UBM (22b) width of about 1200 μm.

TABLE 1

| Temperature ° C. | WLCSP Current/ solder ball (A) | MP-WLCSP Current/ solder block (A) |
| --- | --- | --- |
| 100 | 1.28 | ~11.396 |
| 125 | 0.92 | ~7.87 |
| 140 | 0.77 | ~6.14 |

Figure 4A:
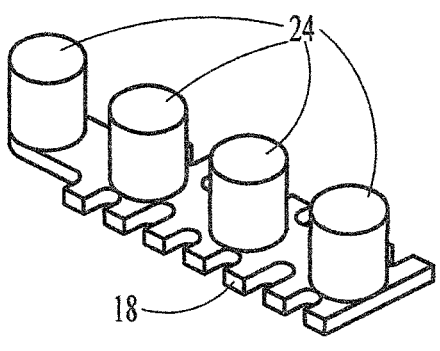
FIG. 4A is an isometric view of solder balls in a WLCSP of the prior art.
Figure 4B:
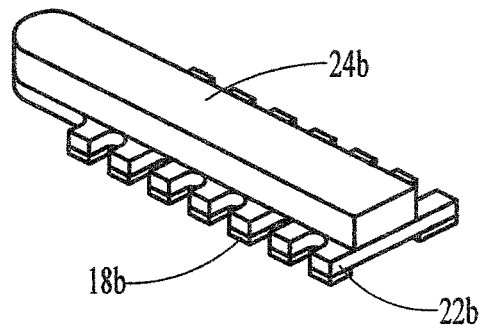
FIG. 4B is an isometric view of a solder block in the MP-WLCSP of the present disclosure.

As shown in Table 2, an electrical simulation was run on high power blocks designed using WLCSP (column 2) and MP-WLCSP (column 3) stackup schemes. In WLCSP (FIG. 4A), four solder balls 24 were used to connect the package/chip to the PCB. In MP-WLCSP (FIG. 4B), one solder block 24b was used to connect the package/chip to the PCB. The parasitic extractions were done under the same AC and DC conditions. From the results shown in Table 2 (below), one can see that the parasitic resistance and inductance of MP-WLCSP are less than those of the WLCSP. The parasitic self capacitance is slightly higher for MP-WLCSP, due to the fact that the surface area of the Under Block Metal (22b) copper is greater in MP-WLCSP compared to standard WLCSP.

TABLE 2

| Parasitic comparison | WLCSP | MP-WLCSP |
| --- | --- | --- |
| DC resistance (mOhm) | 0.337 | 0.0866 |
| AC resistance (mOhm) | 0.410 | 0.132 |
| DC inductance (nH) | 0.017 | 0.016 |
| AC inductance (nH) | 0.014 | 0.013 |
| Self Capacitance (fF) | 34.063 | 35.22 |

In some of the WLCSP packages, some manufacturing rules are compromised (violated) in order to achieve lower parasitic values, to improve the current density, and to reduce the chip size. Such violations might result in reducing the board level reliability of the chip scale packages. In MP-WLCSP, the new stack up dimensions and thicknesses help us achieve very good electrical performance without having to compromise or violate the critical chip scale packaging rules, hence making it more robust with respect to board level reliability and mechanical performance. Some of the important manufacturing rules that are not violated by the MP-WLCSP of the present disclosure include no silicon pads (12) under the Under Block Metal (22b) and Under Pillar Metal (22a), a minimum silicon pad size (12) of 42 μm, and an Under Block Metal (22b) and Under Pillar Metal (22a) density of greater than 25% for a chip size greater than or equal to 5×5 mm$^2$.

Figure 5A:
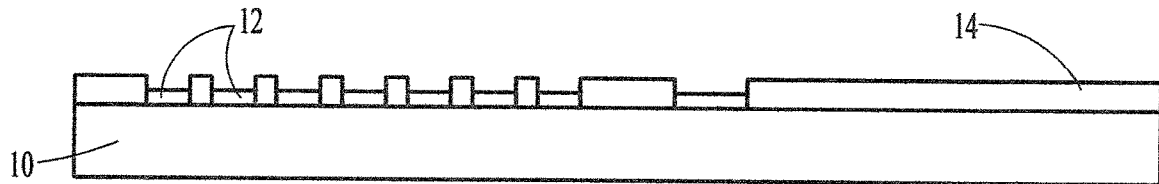
FIGS. 5A-5V are cross-sectional representations of steps in a process of a first preferred embodiment of the present disclosure.
Figure 5B:
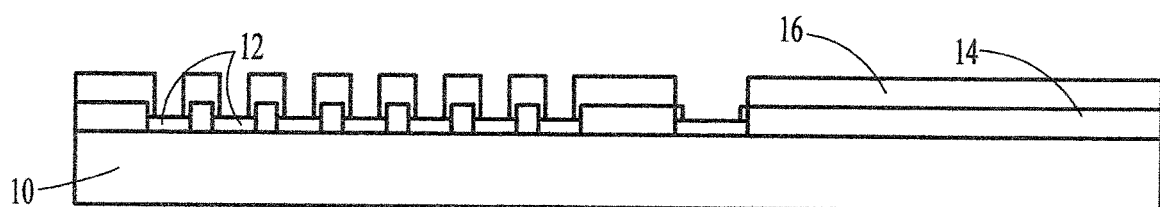
Figure 5C:
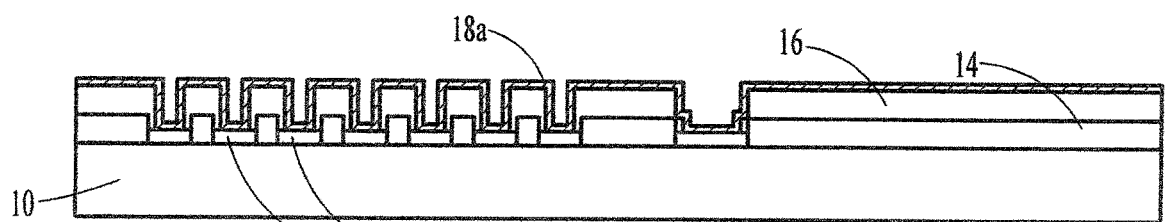
Figure 5D:
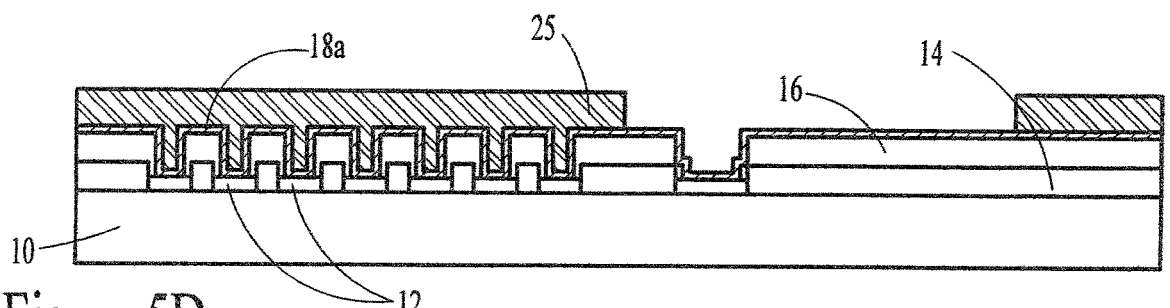
Figure 5E:
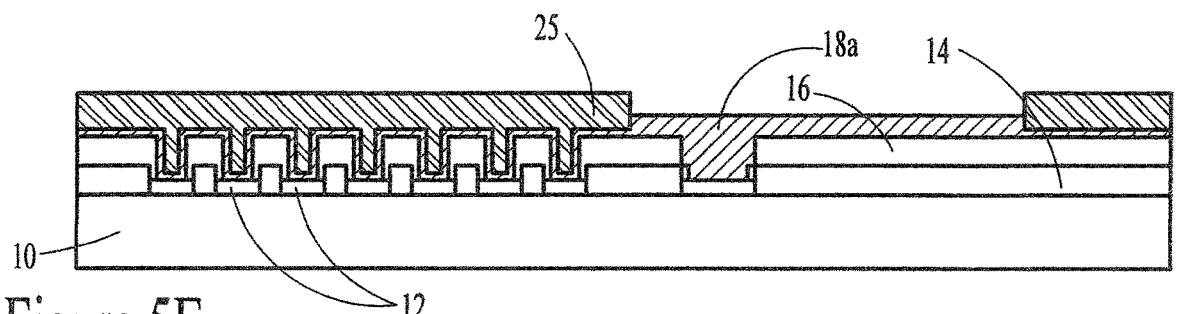
Figure 5F:
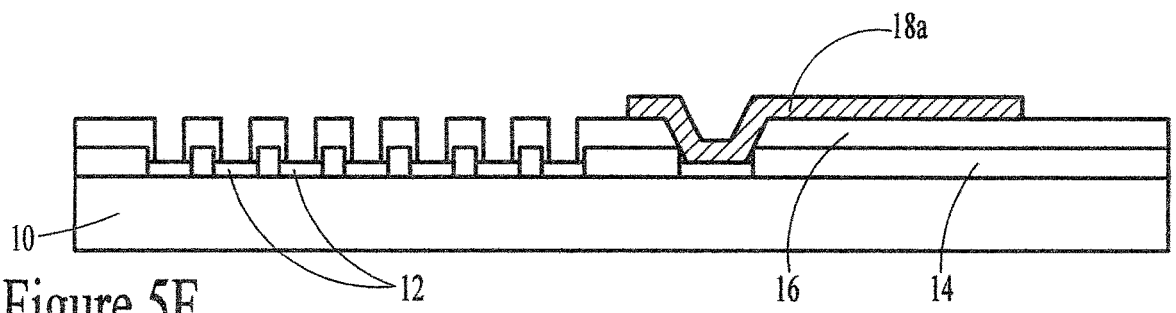
Figure 5G:
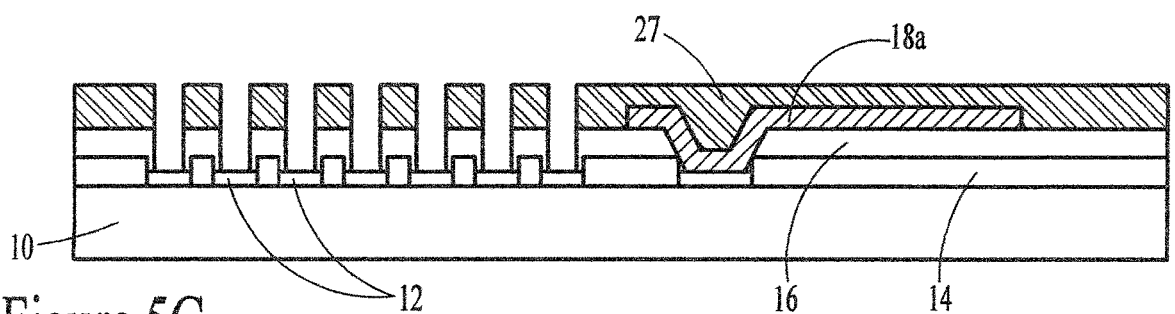
Figure 5H:
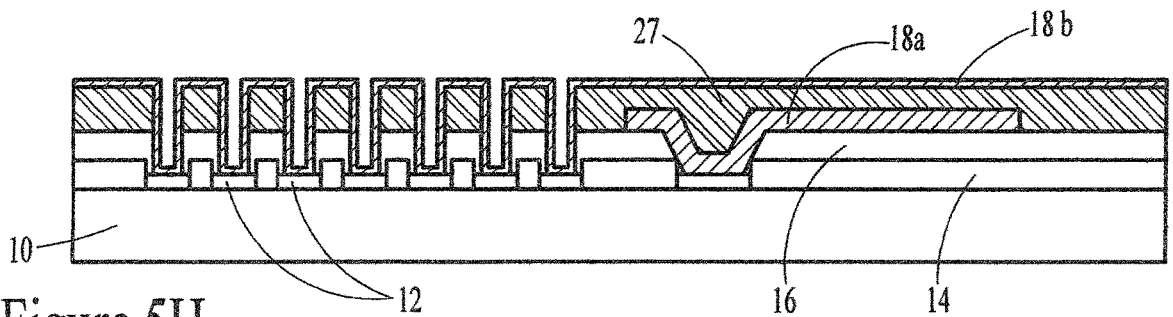
Figure 5I:
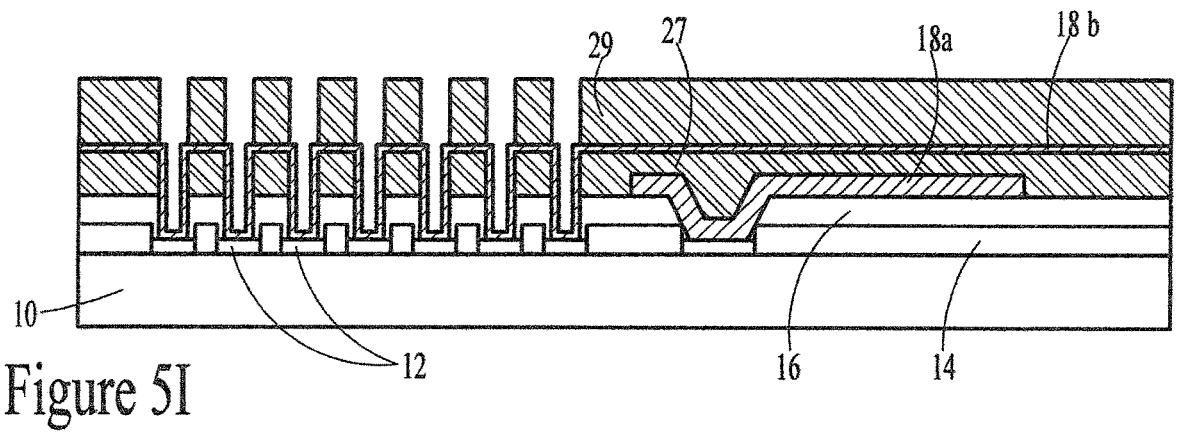
Figure 5J:
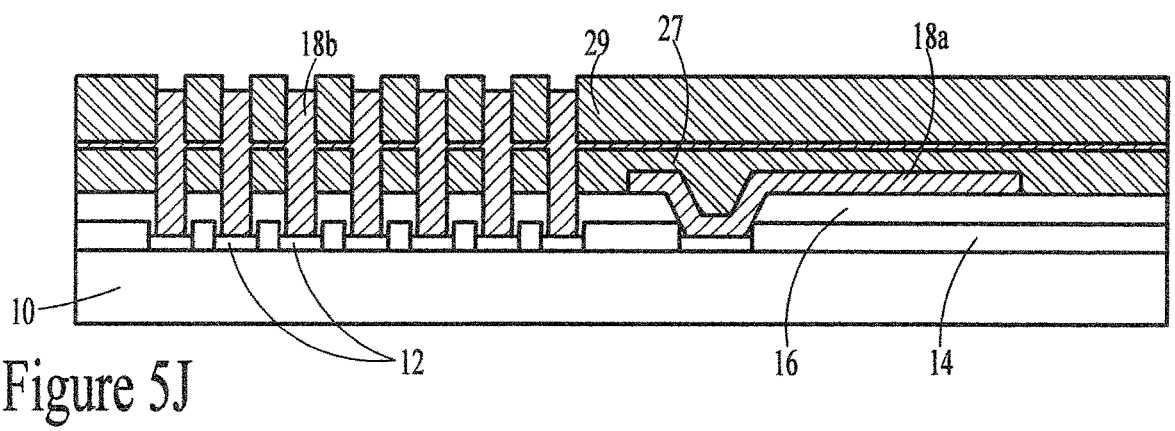
Figure 5K:
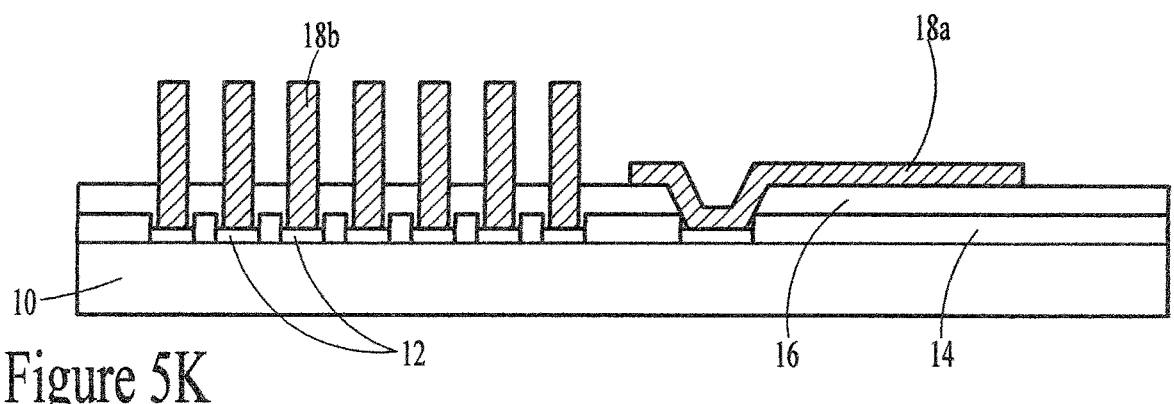
Figure 5L:
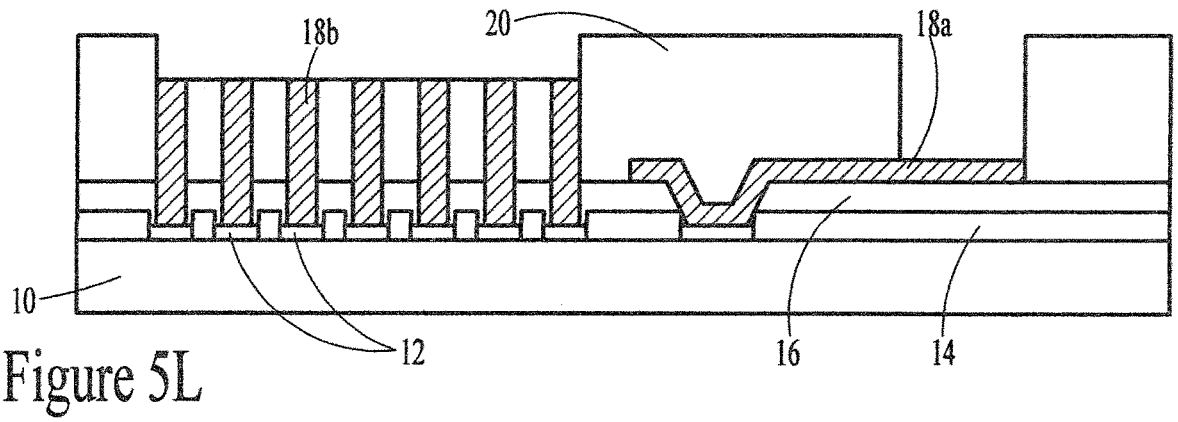
Figure 5M:
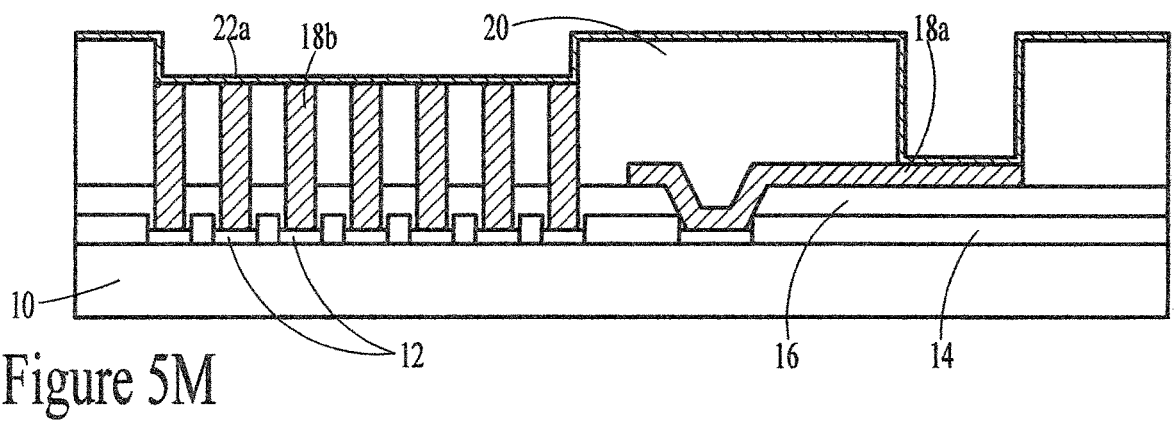
Figure 5N:
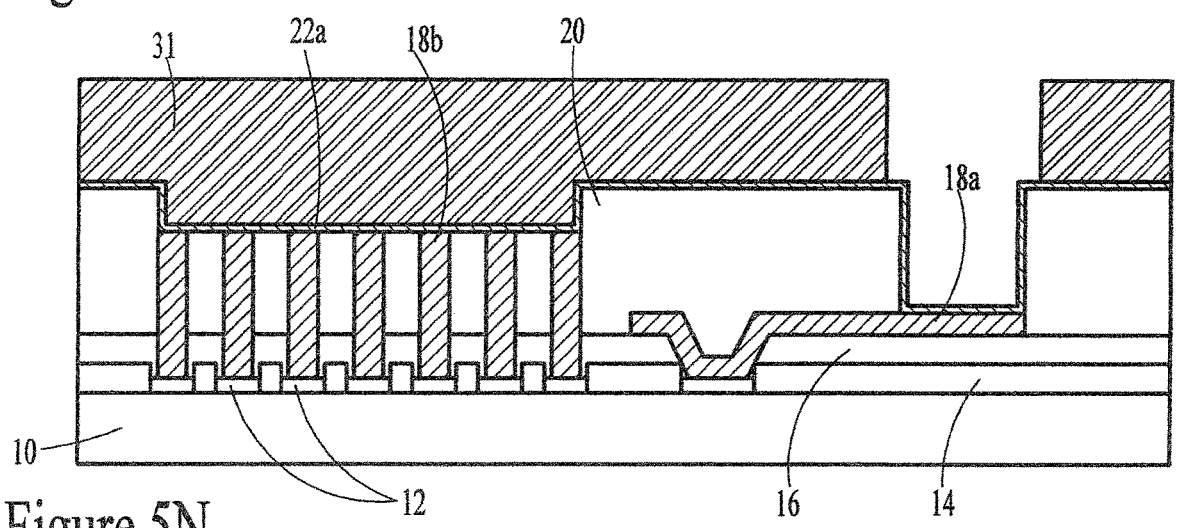
Figure 5O:
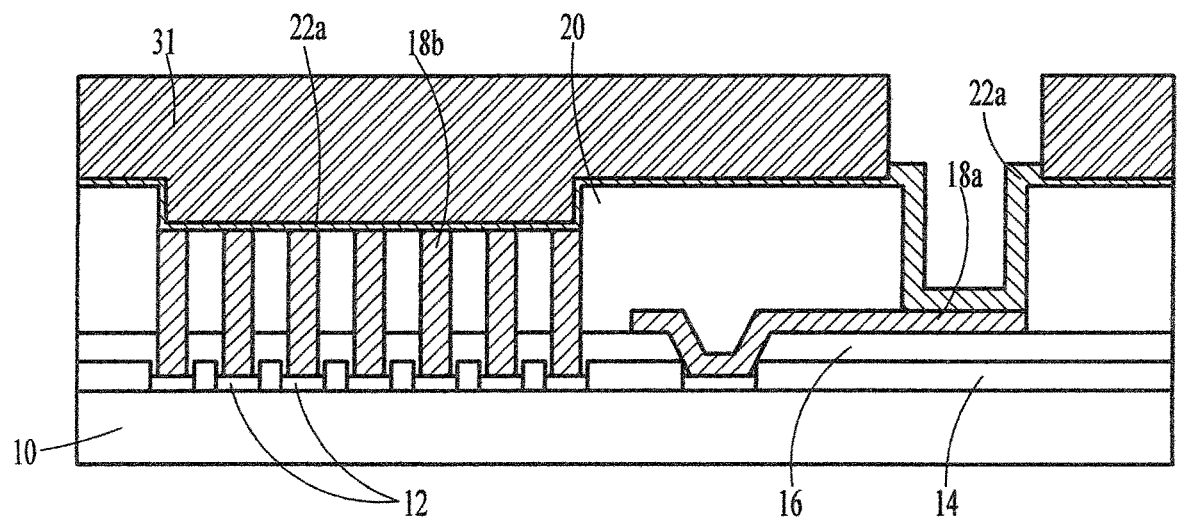
Figure 5P:
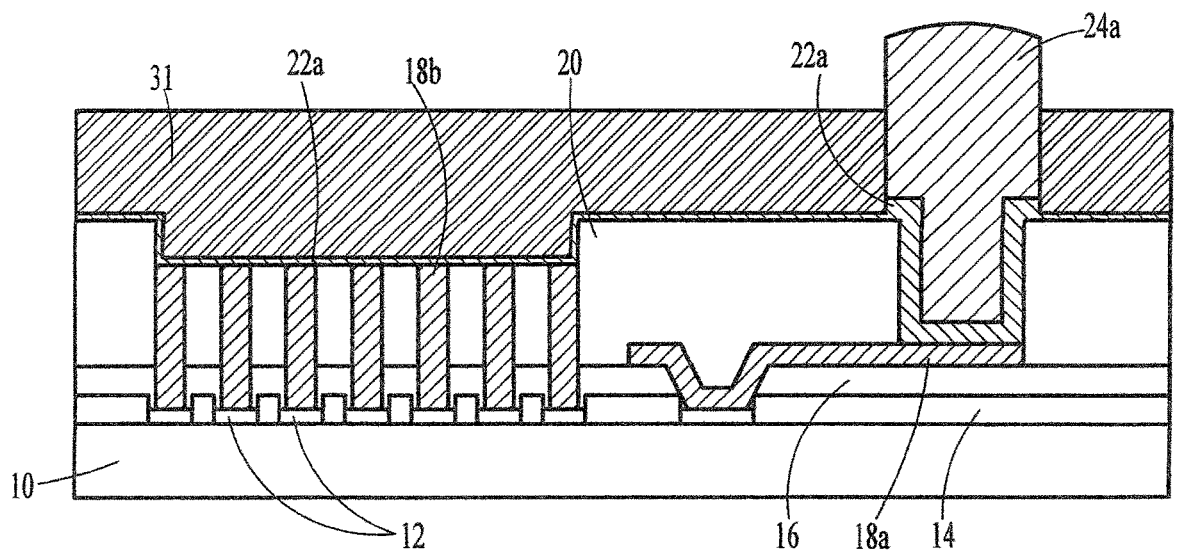
Figure 5Q:
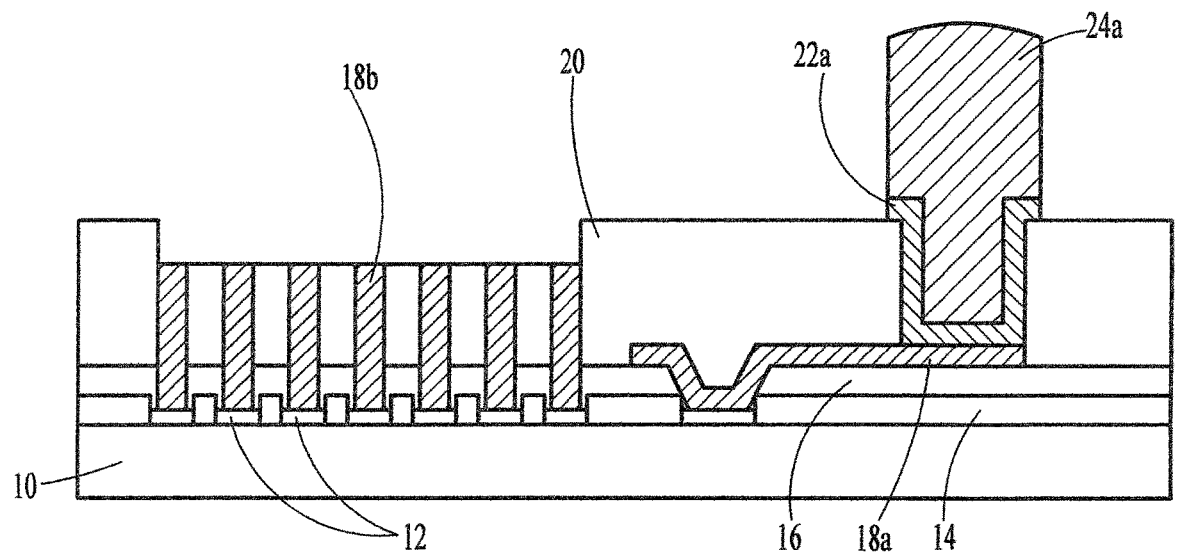
Figure 5R:
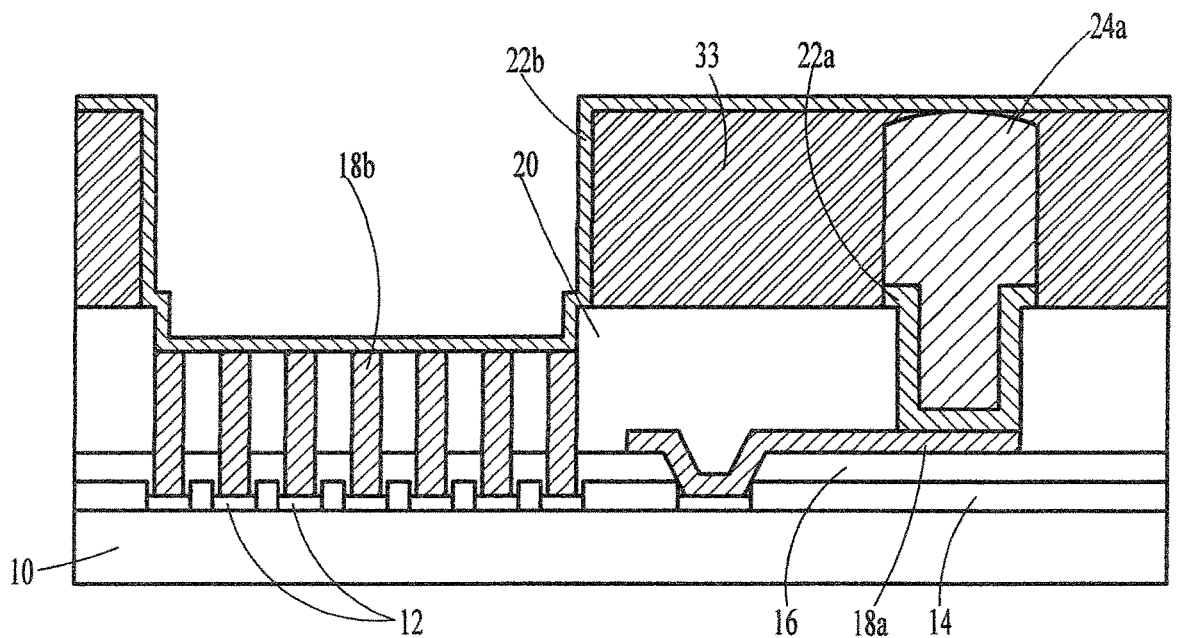
Figure 5S:
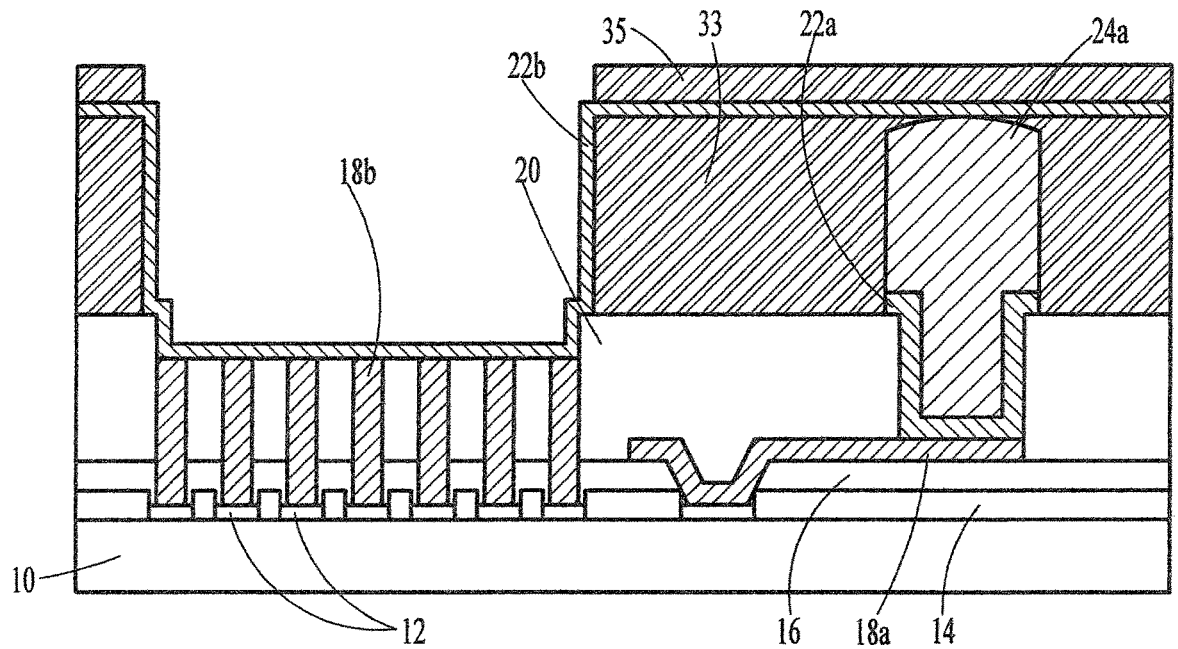
Figure 5T:
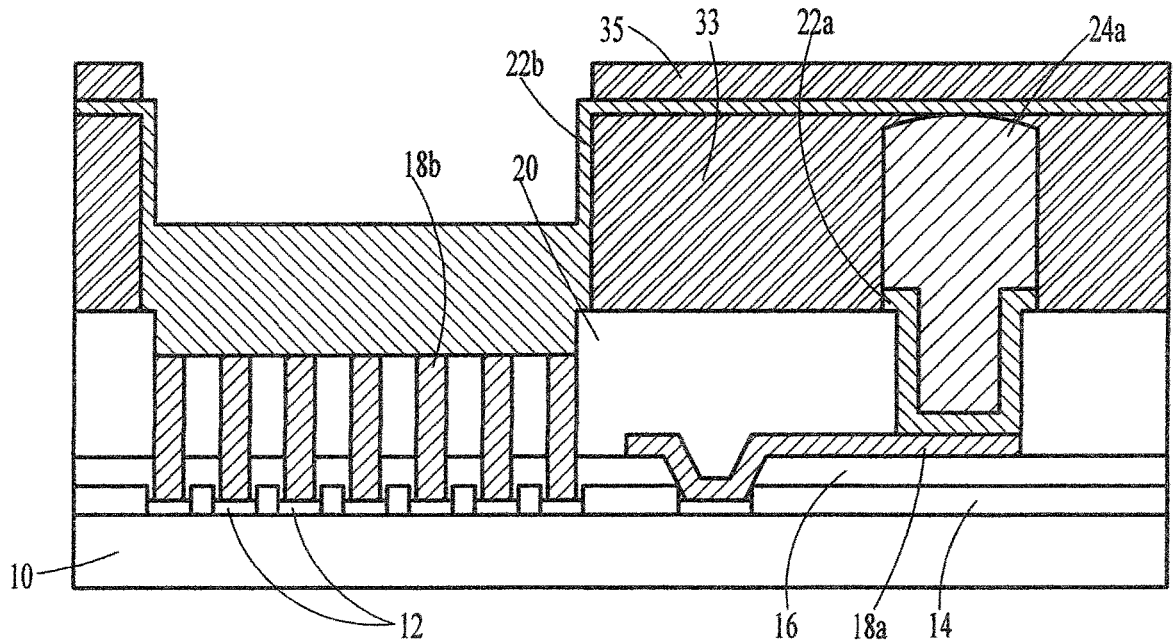
Figure 5U:
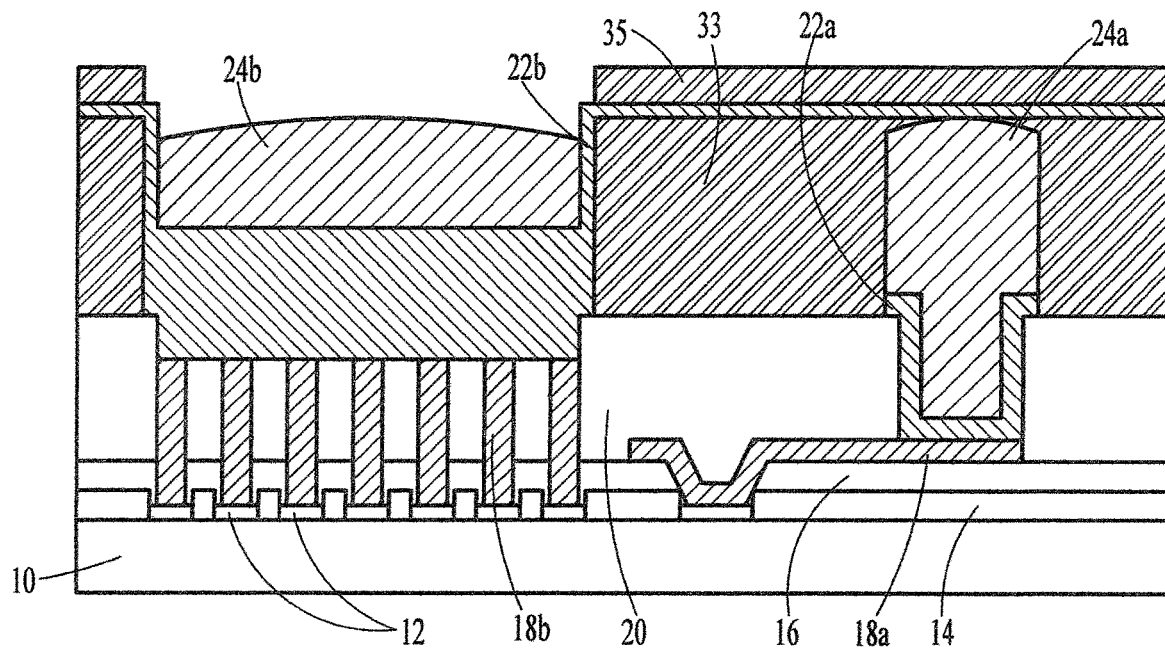
Figure 5V:
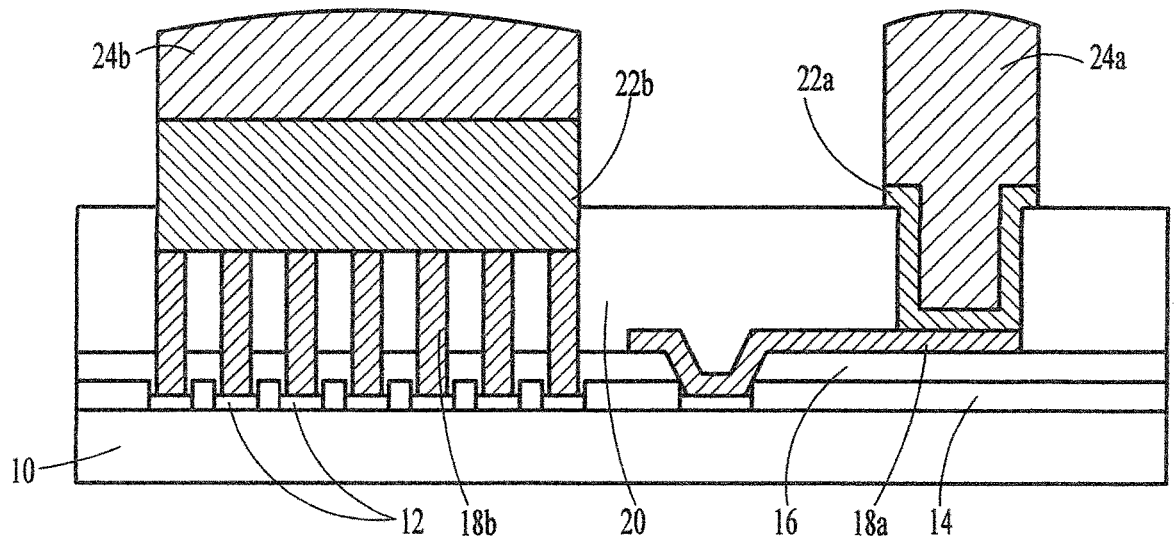

Referring now more particularly to FIGS. 5A-5V, a first preferred embodiment process of the present disclosure will be described. FIG. 5A illustrates a wafer incoming from the wafer fabrication area. Silicon 10 has been coated with a passivation layer 14 through which silicon connection pads 12 have been formed. After inspection of the silicon wafer, a first polymer layer 16 is coated onto the wafer and patterned as shown in FIG. 5B. For example, the polymer may be a polyimide or a polybenzoxazole or any other polymer. The thickness of the polymer can be >=7.5 μm.

Now, referring to FIGS. 5C-5V, a departure from the typical WLCSP process can be seen. In FIG. 5C, RDL trace (low current carrying trace) 18a seed layer is sputtered uniformly on the top of Polymer1 (16). The material used can be Ti/Cu or any other adhesive or seed metal. The preferred thickness of the seed layer 18a is <=0.5 μm.

In FIG. 5D, photo resist PR1 (25) is coated and developed. The development of the PR1 will be based on the mask designed for RDL traces (18a). Then, a RDL trace metal is plated over the exposed RDL trace seed layer as illustrated in FIG. 5E. The preferred material used for plating is Copper (Cu), but any other plating metal layer can be used. The combination of plated metal layer and seed layer forms the RDL trace (18a). After removing the photo resist PR1 (25) and etching the unwanted RDL trace seed layer, the desired RDL trace 18a is left over. This is illustrated in FIG. 5F. The preferred thickness of the RDL trace 18a is >=4 μm and <=25 μm.

Next, as shown in FIG. 5G, photo resist PR2 (27) is coated and developed. The development of the PR2 will be based on the mask designed for RDL_VIA (18b). Then, as illustrated in FIG. 5H, a RDL_VIA seed layer is sputtered uniformly on the top of PR2 (27). The material used can be Ti/Cu or any other adhesive or seed metal. The preferred thickness of the seed layer 18b is <=2 μm.

Now, photo resist PR3 (29) is coated and developed on top of the seed layer, as shown in FIG. 5I, based on the mask designed for the RDL_VIA (18b) plating. FIG. 5J illustrates plating of the RDL_VIA metal over the exposed RDL_VIA seed layer. The preferred material used for plating is Copper (Cu), but any other plating metal can be used. The combination of plated metal layer and seed layer forms the RDL_VIA (18*b*).

After removing the photo resist PR2 (27) and PR3 (29) and etching the unwanted RDL_VIA seed layer, the desired RDL_VIA 18*b* is left over. This is illustrated in FIG. 5K. The preferred thickness of RDL_VIA 18*b* is >=25 µm and <50 µm.

Next, as shown in FIG. 5L, a second polymer layer 20 is deposited to a thickness of 7.5 µm or more and patterned to provide openings for placing of pins. For example, the polymer may be a polyimide or a polybenzoxazole, or any other polymer.

Referring now to FIG. 5M, the Under Pillar Metal (UPM) seed layer 22*a* for the low current carrying UPM is sputtered. This layer may be Titanium/copper or any other adhesive or seed metal. The preferred thickness of the seed layer 22*a* is <=0.5 µm.

As illustrated in FIG. 5N, photo resist PR4 (31) is coated and developed. The development of the PR4 will be based on the mask designed for UPM (22*a*). Then, a UPM metal is plated over the exposed UPM seed layer as illustrated in FIG. 5O. The preferred material used for plating is Copper (Cu), but any other plating metal could be used. The combination of plated metal layer and seed layer forms the UPM 22*a* having a preferred thickness>=8 µm and <=25 µm.

Now, as shown in FIG. 5P, the solder pillar (SP) 24*a* is plated over the UPM 22*a*. The plating material may be SAC405, SAC305, or SAC Q or any other solder alloy.

As shown in FIG. 5Q, the PR4 31 is stripped and the UPM seed layer not covered by the solder pillar 24*a* is etched away.

Next, the high current area pins are to be formed. As shown in FIG. 5R, a photo resist PR5 (33) is coated and developed, based on the mask designed for the Under Block Metal (UBM) 22*b*. A UBM seed layer 22*b* for the high current carrying signals is sputtered over the PR5 and within the openings. This layer may be Titanium/copper or any other adhesive or seed metal. The preferred thickness of the seed layer 22*b* is <=2 µm.

Now, another photo resist layer PR6 (35) is coated and developed as shown in FIG. 5S. Next, as shown in FIG. 5T, a UBM metal is plated over the exposed UBM seed layer. The preferred material used for plating is Copper (Cu), but any other plating metal could be used. The combination of plated metal layer and seed layer forms the UBM 22*b* having a preferred thickness of >=25 µm and <=50 µm.

Now, as shown in FIG. 5U, the solder block (SB) 24*b* is plated over the UBM 22*b*. The plating material may be SAC405, SAC305, or SAC Q or any other solder alloy.

As shown in FIG. 5V, the PR5 33 and PR6 35 are stripped and the UBM seed layer not covered by the solder block 24*b* is etched away.

It is important that both the solder pillar 24*a* and solder block 24*b* are plated to the same final level so that both end up in the same horizontal plane. The final thickness of the solder pillars will be greater than about 120 µm and the final thickness of the solder blocks will be greater than about 100 µm.

Figure 8:
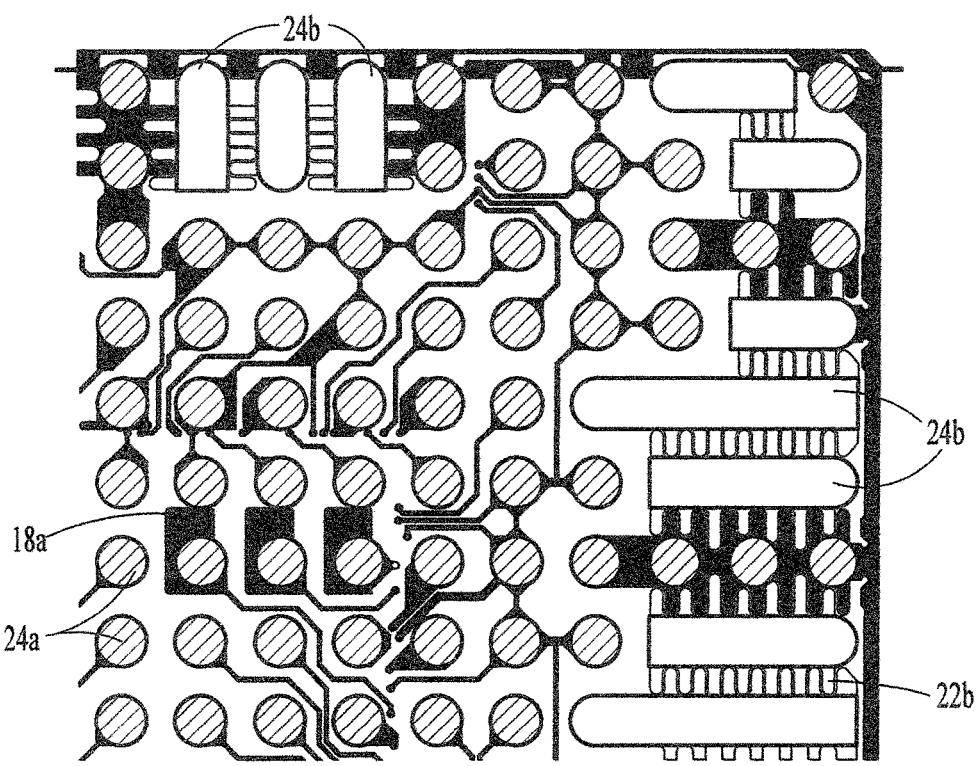
FIG. 8 is a top view representation of a sample layout of solder blocks and solder pillars in the present disclosure.

FIG. 8 illustrates a top view of a sample layout of solder pillars 24*a* and solder blocks 24*b*. For better understanding, the solder pillars 24*a* are shown with hatching and solder blocks 24*b* are not hatched. The assembly processing cost of MP-WLCSP is almost the same as the conventional WLCSP process cost.

Figure 9:
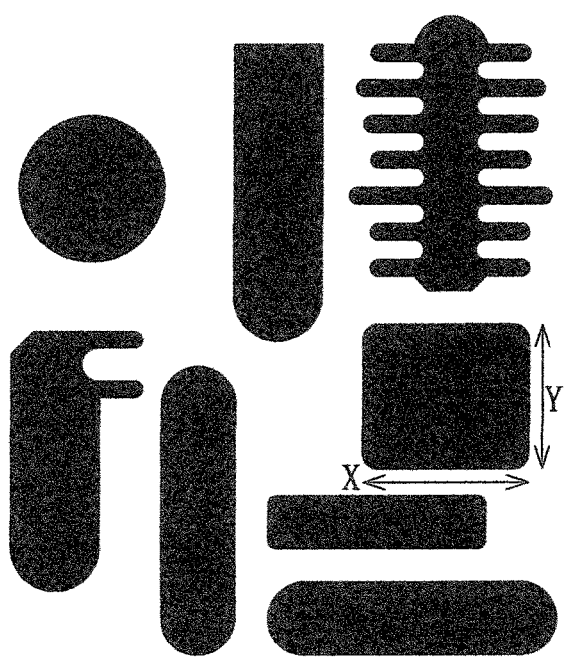
FIG. 9 is a top view representation of various UBM shapes in the present disclosure.
Figure 10:
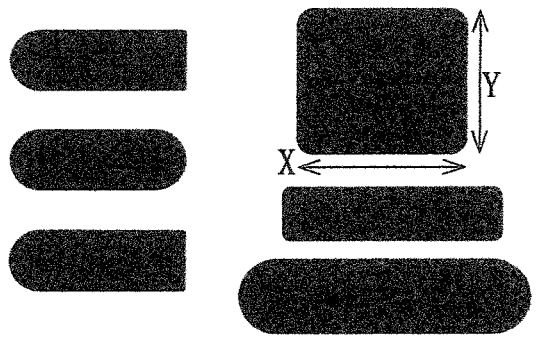
FIG. 10 is a top view representation of various solder block structure shapes in the present invention.

FIG. 9 illustrates various UBM shapes. FIG. 10 illustrates various solder block structure shapes. Any shape is possible, but at least one side of the UBM (FIG. 9) or the solder block (FIG. 10) in a two-dimensional plane should be greater than 600 µm. In both figures, X is the maximum edge to edge distance in one direction and Y is the maximum edge to edge distance in the other direction. In order to support high currents, the UBM and the solder block can have X>Y (if X is greater than 600 µm) or Y>X (if Y is greater than 600 µm) or X=Y (if X and Y are greater than 600 µm).

Figure 11:
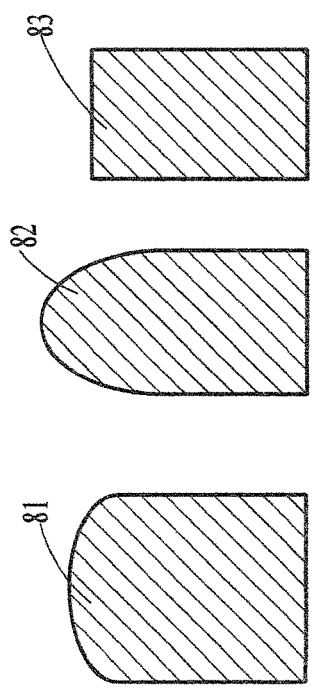
FIG. 11 is a cross-sectional representation of alternative pillar top surfaces in the present disclosure.

The solder pillars 24*a* and blocks 24*b* may have a flat or a curved top surface. FIG. 11 shows two exemplary pillar curved top surfaces 81 and 82 and a pillar flat top surface 83. Solder blocks also may have either flat or curved top surfaces, not shown. Curved surfaces might be better than flat surfaces from the point of view of soldering the device onto PCB's.

Referring now to FIGS. 5A-5H and 6A-6N, a second preferred embodiment of the present disclosure is described. In this second alternative process, the steps are identical to the first embodiment through FIG. 5H. As shown in FIG. 5H, RDL trace 18*a* has been formed and the seed layer 18*b* in the high current area has been deposited.

Figure 6A:
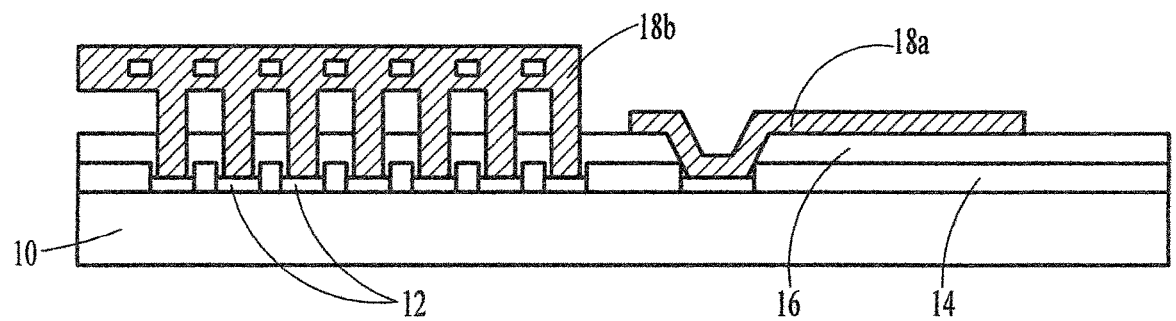
FIGS. 6A, 6C-6J, 6L, and 6N are cross-sectional representations of steps in a process of a second preferred embodiment of the present disclosure.
Figure 6B:
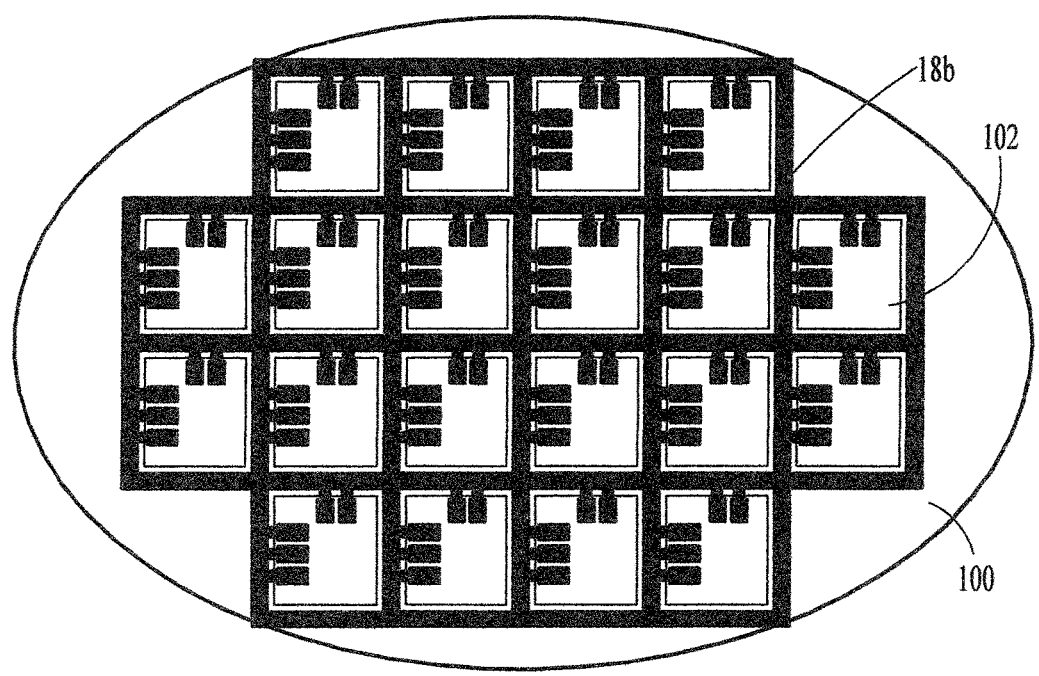
FIG. 6B is a wafer level representation of the RDL_VIA strip placement for the second preferred embodiment of the present disclosure.

Now, as illustrated in FIG. 6A, RDL_VIA strip 18*b* is placed in the vias. FIG. 6B shows a top view of a portion of a simplified wafer 100 having a plurality of chips 102. The strip 18*b* is placed on all of the chips on the wafer simultaneously. This is a simple way to provide the thick, wide RDL_VIA for the high current carrying package pins. The RDL_VIA strip can be copper or any other metal. After the RDL_VIA strip 18*b* is placed, the seed layer is etched away where it is not covered by the strip and photoresist 27 is removed, as shown in FIG. 6A.

Figure 6C:
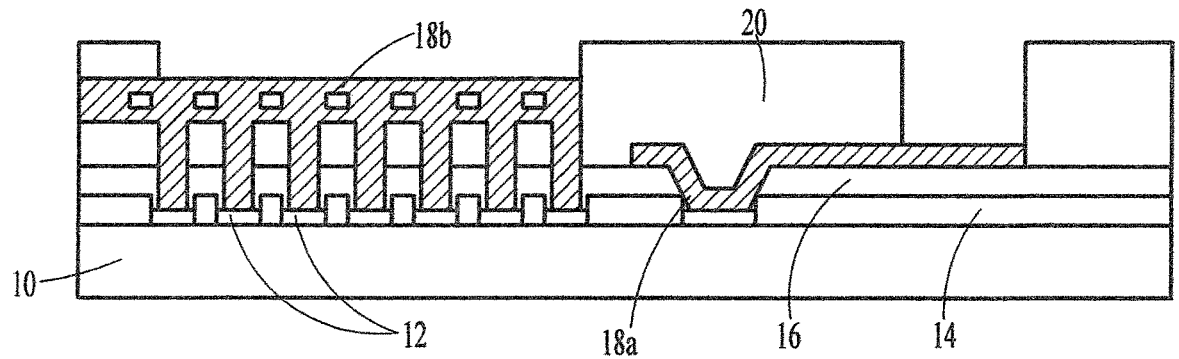

Next, as shown in FIG. 6C, a second polymer layer 20 is deposited to a thickness of >=7.5 µm and patterned to provide openings for placing of pins. For example, the polymer may be a polyimide or a polybenzoxazole, or any other polymer.

Figure 6D:
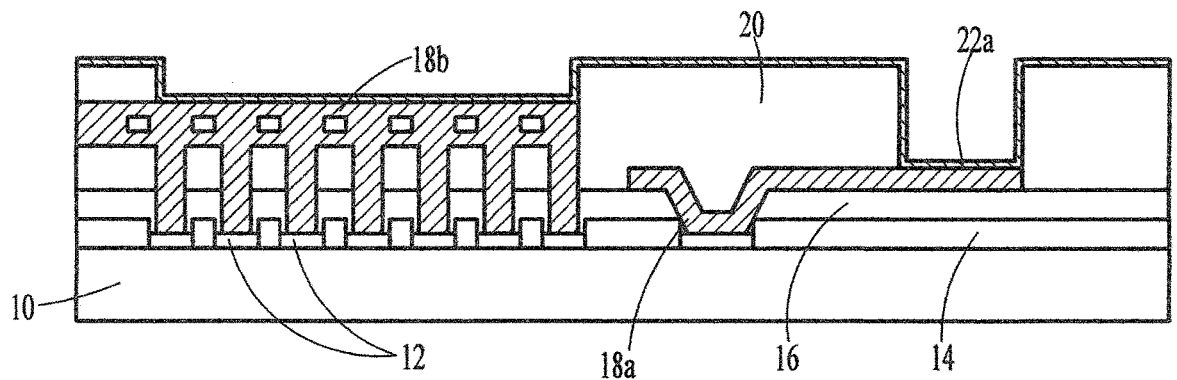

Referring now to FIG. 6D, the UPM seed layer 22*a* is sputtered to a thickness of <=0.5 µm. This layer may be Titanium/copper or any other adhesive or seed metal.

Figure 6E:
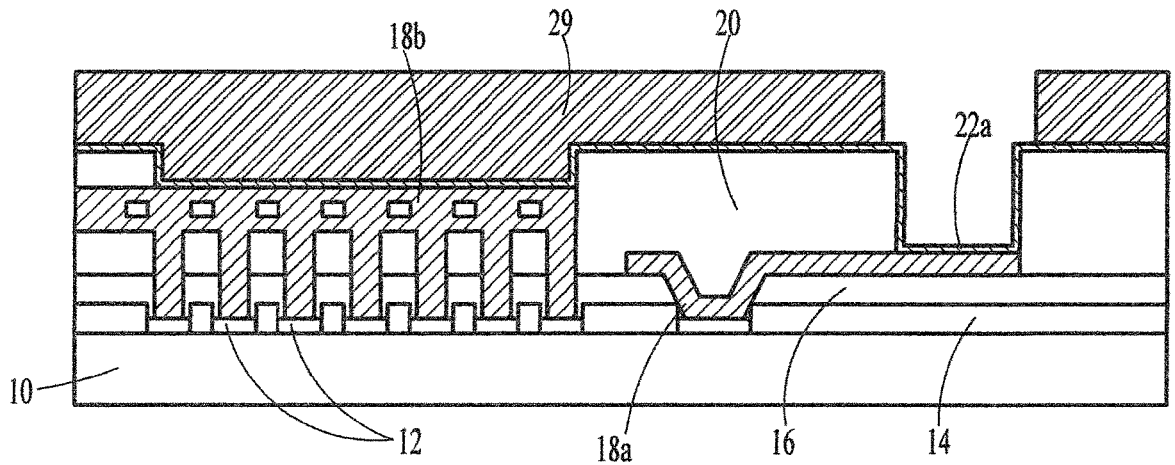
Figure 6F:
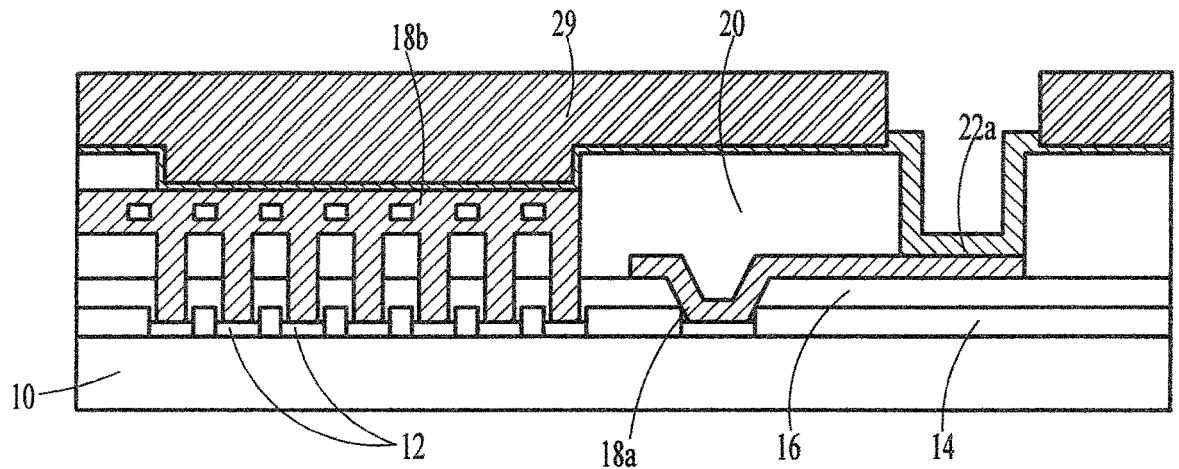

Referring now to FIG. 6E, a photo resist PR3 (29) is coated and developed. The development of the PR3 will be based on the mask designed for UPM (22*a*). Then, in FIG. 6F, a UPM metal is plated over the exposed UPM seed layer. The preferred material used for plating is Copper (Cu), but any other plating metal could be used. The combination of plated metal layer and seed layer forms the UPM 22*a* having a preferred thickness>=8 µm and <=25 µm.

Figure 6G:
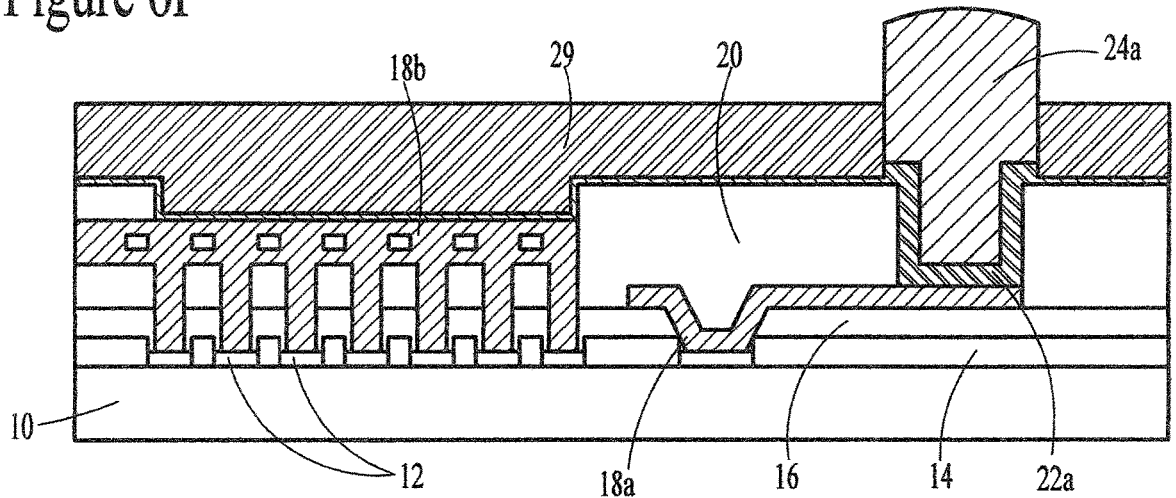

Now, as shown in FIG. 6G, the solder pillar (SP) 24*a* is plated over the UPM 22*a*. The plating material may be SAC405, SAC305, or SAC Q or any other solder alloy.

Figure 6H:
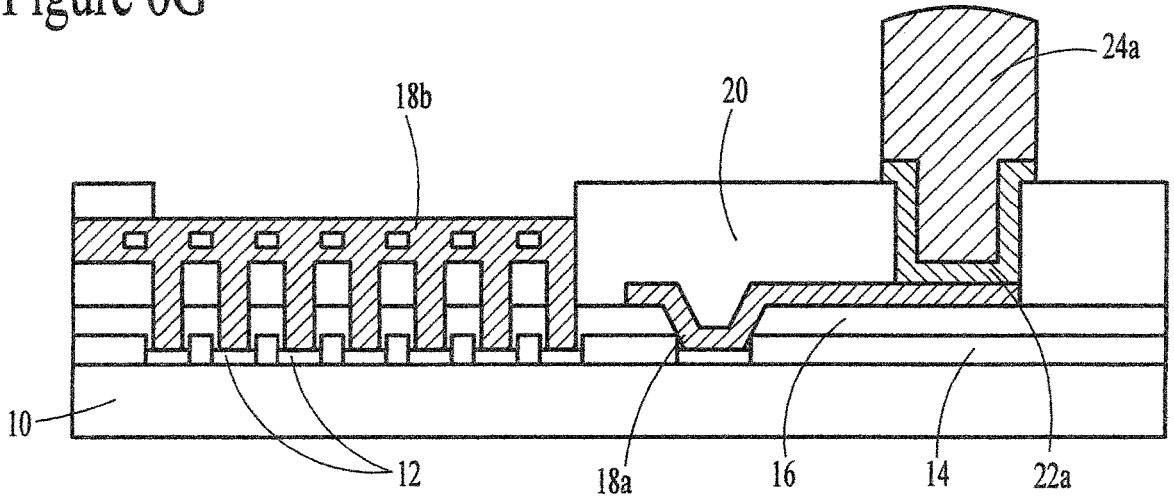

The PR3 29 is stripped and the UPM seed layer not covered by the solder pillar 24*a* is etched away, as shown in FIG. 6H.

Figure 6I:
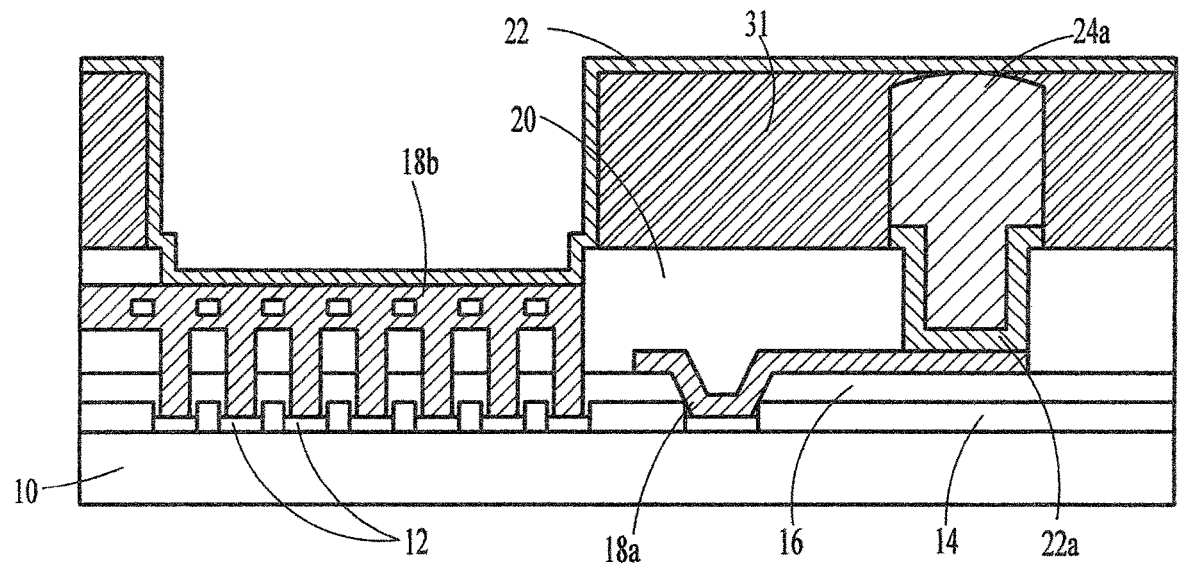

Next, the high current area pins are to be formed. As shown in FIG. 6I, a photo resist PR4 (31) is coated and developed, based on the mask designed for the Under Block Metal (UBM) 22. A UBM seed layer 22 for the high current carrying signals is sputtered over the PR4 and within the openings. This layer may be Titanium/copper or any other adhesive or seed metal. The preferred thickness of the seed layer 22 is <=2 µm.

Figure 6J:
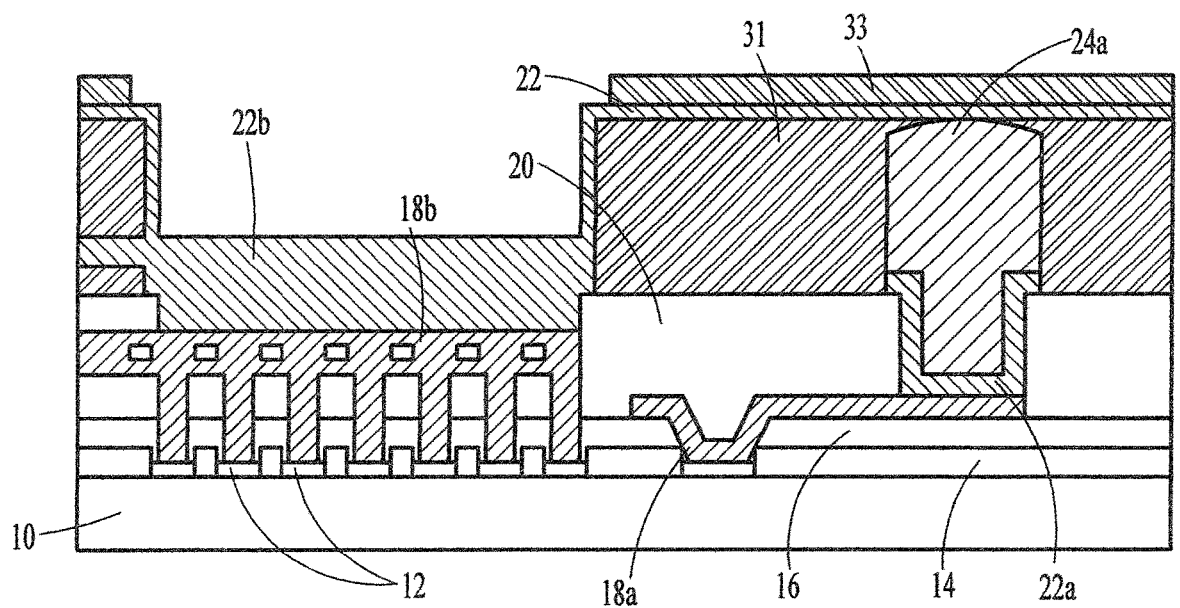
Figure 6K:
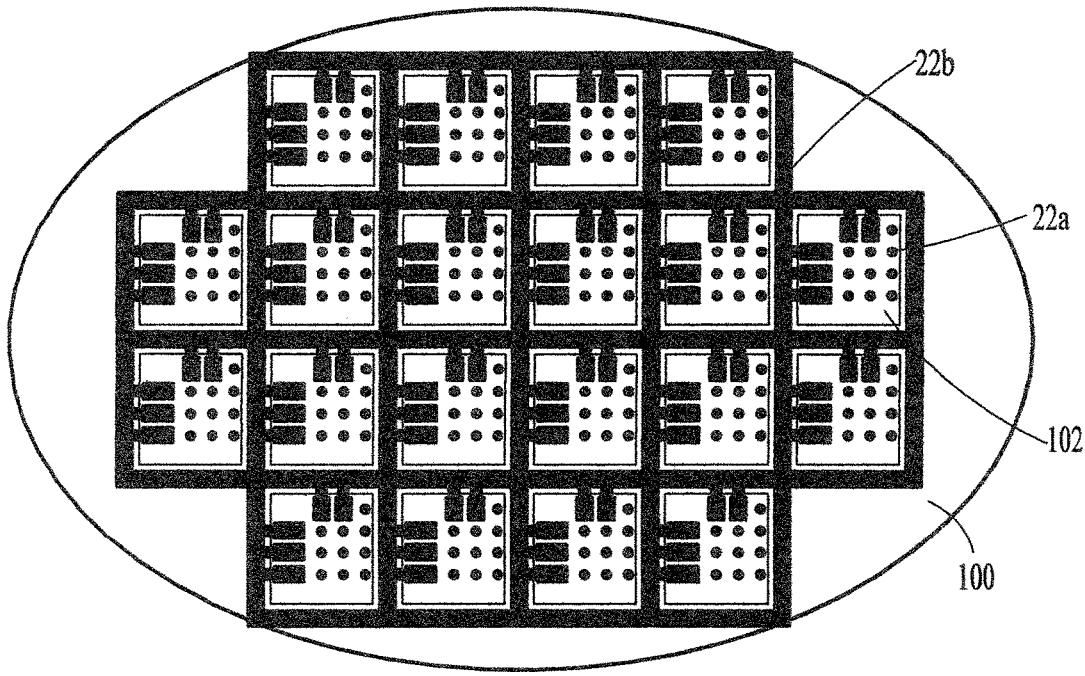
FIG. 6K is a wafer level representation of the UBM strip placement for the second preferred embodiment of the present disclosure.

Now, a UBM strip 22*b* is placed within the PR4 openings, as shown in FIG. 6J. FIG. 6K is a wafer level view of the placing of the UBM strip 22b on the chips of the wafer. UPM 22a are shown. The solder pillars and photo resist are not shown in this figure.

Figure 6L:
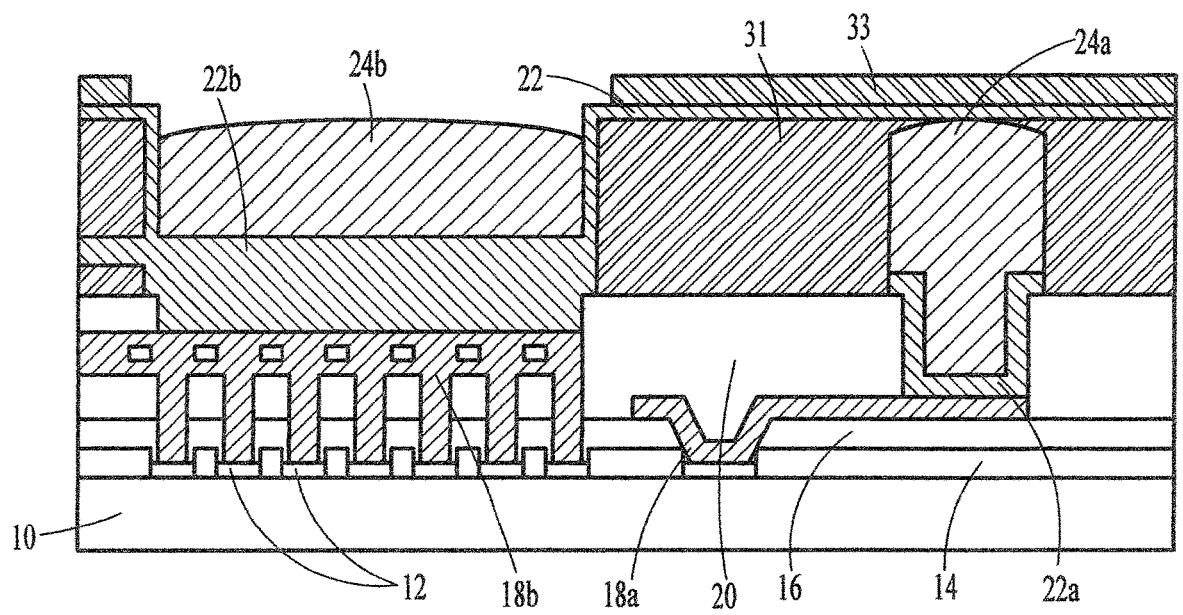

Returning to FIG. 6J, another photo resist layer PR5 (33) is coated and developed. Now as shown in FIG. 6L, the solder block (SB) 24b is plated over the UBM strip 22b. The plating material may be SAC405, SAC305, or SAC Q or any other solder alloy.

It is important that both the solder pillar 24a and solder block 24b are plated to the same final level so that both end up in the same horizontal plane. The final thickness of the solder pillars will be greater than about 120 µm and the final thickness of the solder blocks will be greater than about 100 µm.

Figure 6M:
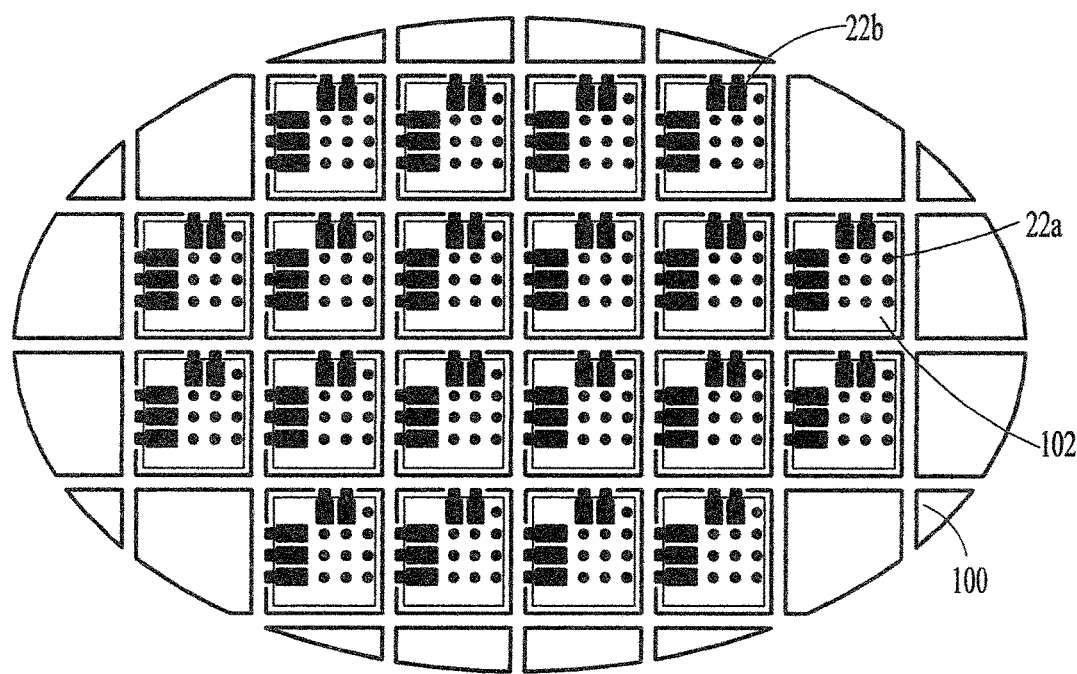
FIG. 6M is a wafer level representation after a sawing and trimming step for the second preferred embodiment of the present disclosure.
Figure 6N:
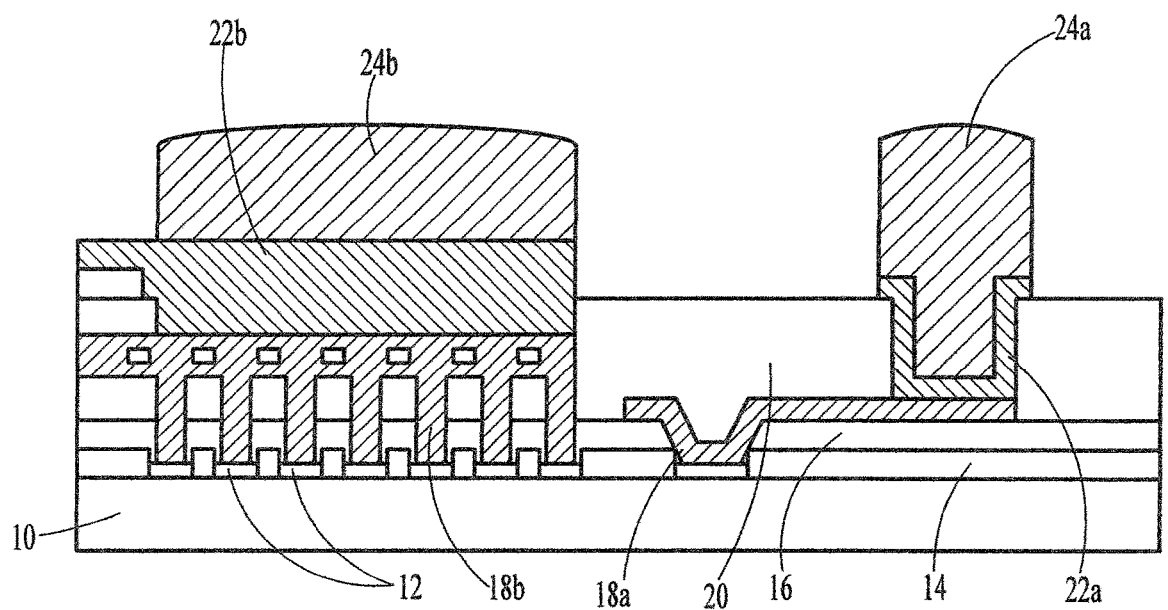

FIG. 6M shows the wafer level view after photoresist stripping and the final step of sawing and trimming away the excess strip material, leaving the RDL_VIA and UBM as shown. FIG. 6N shows the final cross-sectional view after PR4 31 and PR5 33 stripping, etching away the UBM seed layer not covered by the solder block 24b, sawing, and trimming.

Figure 7A:
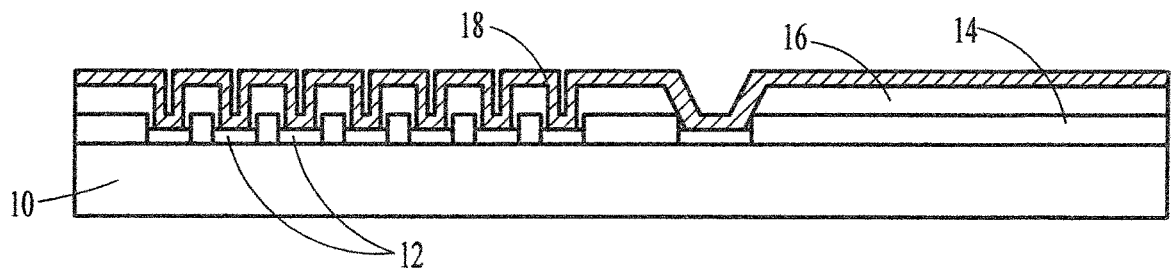
FIGS. 7A-7L are cross-sectional representations of steps in a process of a third preferred embodiment of the present disclosure.

A third preferred embodiment of the present disclosure is described with reference to FIGS. 5A-5B and 7A-7L. In this process, the first two steps are identical to FIGS. 5A-5B. Next, as shown in FIG. 7A, RDL layer 18 is sputter deposited over the patterned polymer layer 16 and contacting the silicon pads 12 using a thick uniform sputtering process. The RDL layer may comprise Titanium/Copper or any other seed metal material sputtered to a thickness of <=2 µm.

Figure 7B:
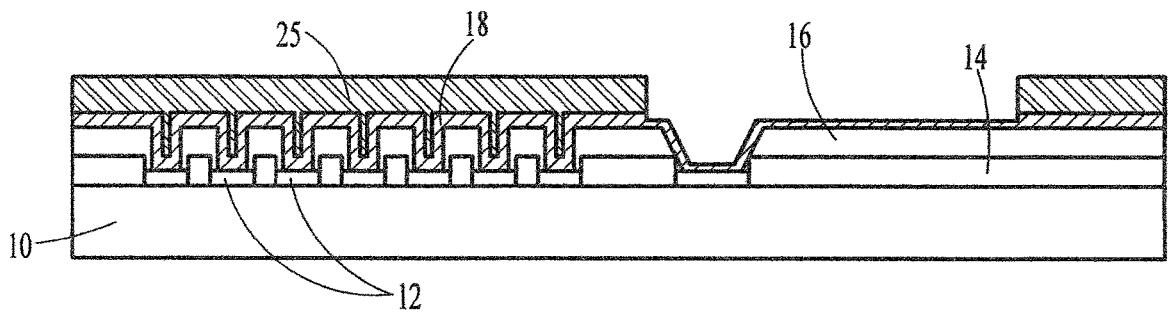

A first photo resist layer PR1 (25) is coated and developed according to the pattern for the RDL trace, shown in FIG. 7B. The RDL seed layer is etched to reduce its thickness in the low current area exposed by the mask 25. The etching should remove the seed layer up to a thickness of <=1.5 µm so that a final thickness of <=0.5 µm seed layer thickness remains in the low current area.

Figure 7C:
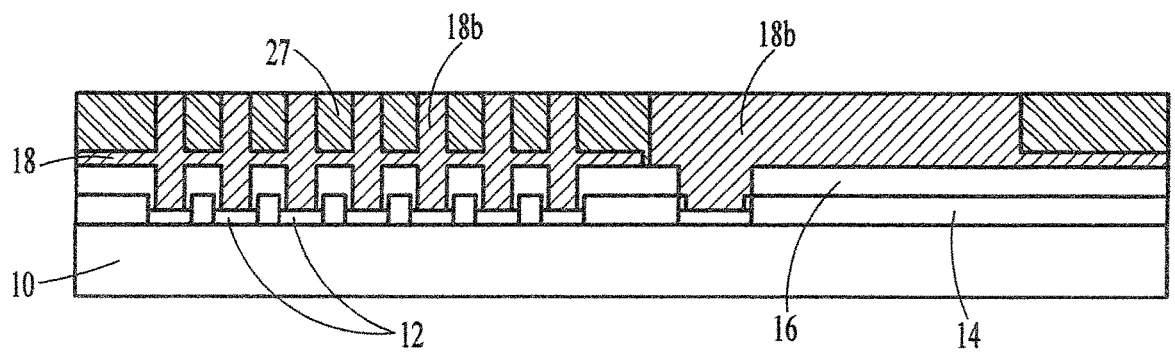

The PR1 25 is stripped and a new photo resist PR2 27 is formed leaving openings in both the low and high current areas. Copper, or other metal, is plated on the seed layer exposed by mask 27 in a thick uniform plating process, as shown in FIG. 7C, to form plated layer 18b.

Figure 7D:
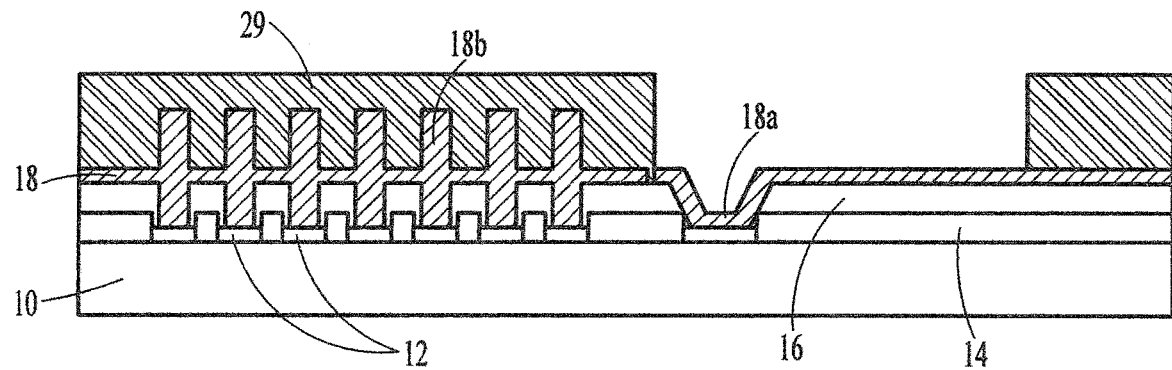

The photoresist mask 27 is stripped and another mask PR3 29 is formed to expose only the low current area. The RDL plated layer is etched back to reduce the Cu thickness in the low current area 18a, as shown in FIG. 7D.

Figure 7E:
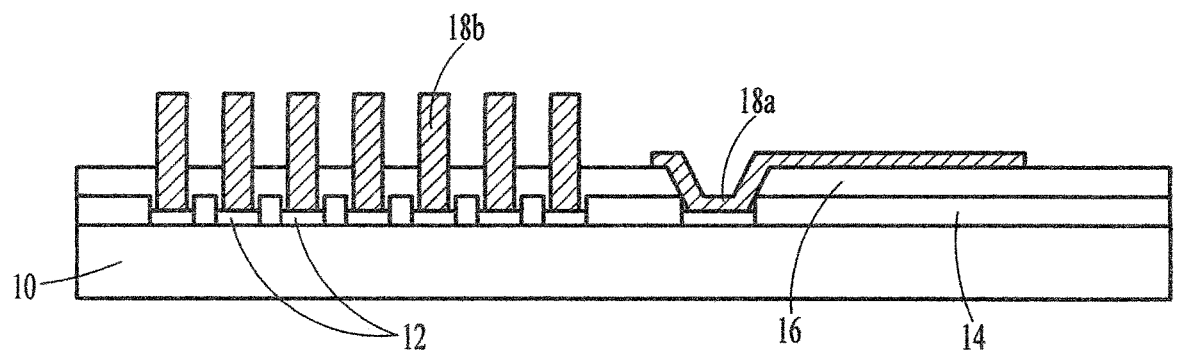

Next, as shown in FIG. 7E, the PR3 29 is stripped and the sputtered RDL layer 18 is etched away. Because it is much thicker, the plated RDL layer remains mostly intact.

The thickness of the final RDL_trace 18a is >=4 µm and <=25 µm. The thickness of the final RDL_VIA 18b is >=25 µm and <=50 µm.

Figure 7F:
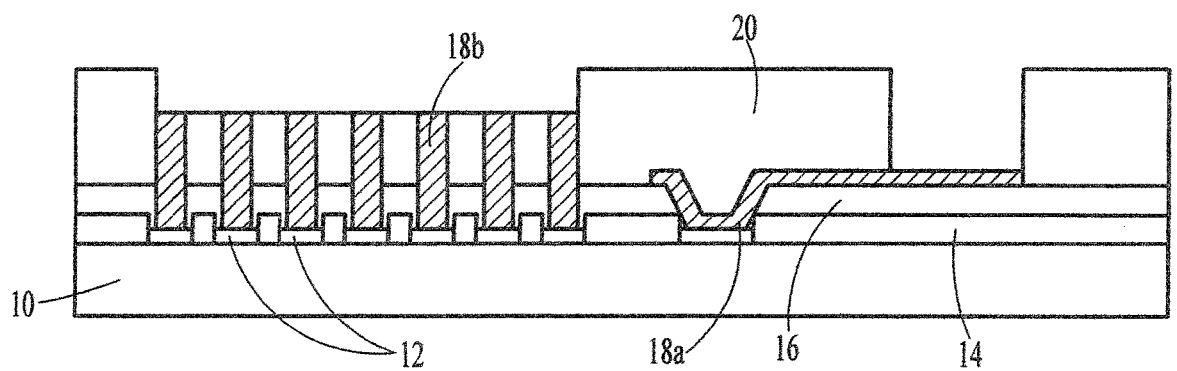

Referring now to FIG. 7F, a second polymer layer 20 is deposited to a thickness of >=7.5 µm and patterned to provide openings for placing of pins. For example, the polymer may be a polyimide or a polybenzoxazole or any other polymer.

Figure 7G:
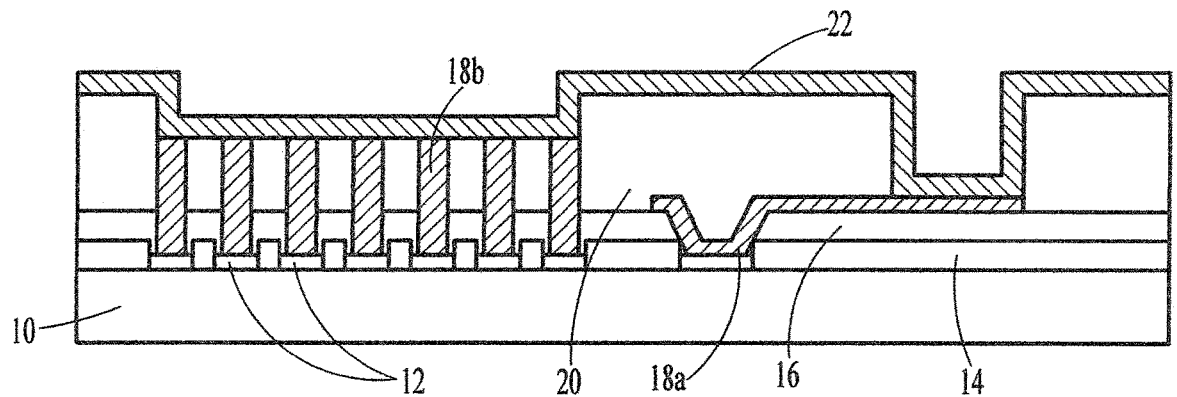

Referring now to FIG. 7G, the seed layer 22 for the UBM for high current signals and the UPM for low current signals is sputtered to a thickness of about <=2 µm. This layer may be Titanium/copper or any other seed metal. This is a thick, uniform sputtering.

Figure 7H:
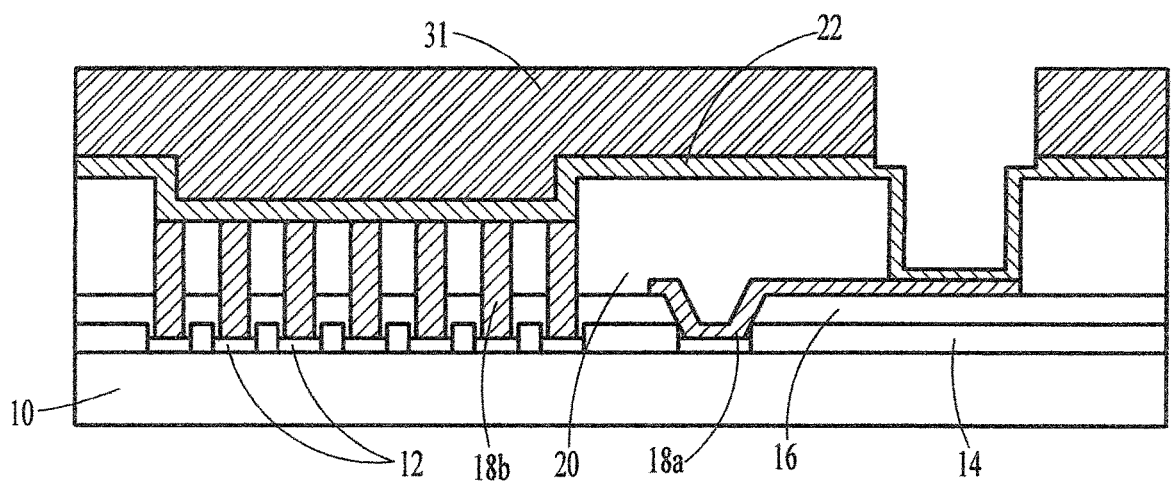

A photo resist PR4 (31) is coated and developed over the UBM layer 22 having openings where the low current carrying pins will be formed, as shown in FIG. 7H. The seed layer 22 is etched to reduce its thickness in the low current areas. The final thickness is <=0.5 µm.

Figure 7I:
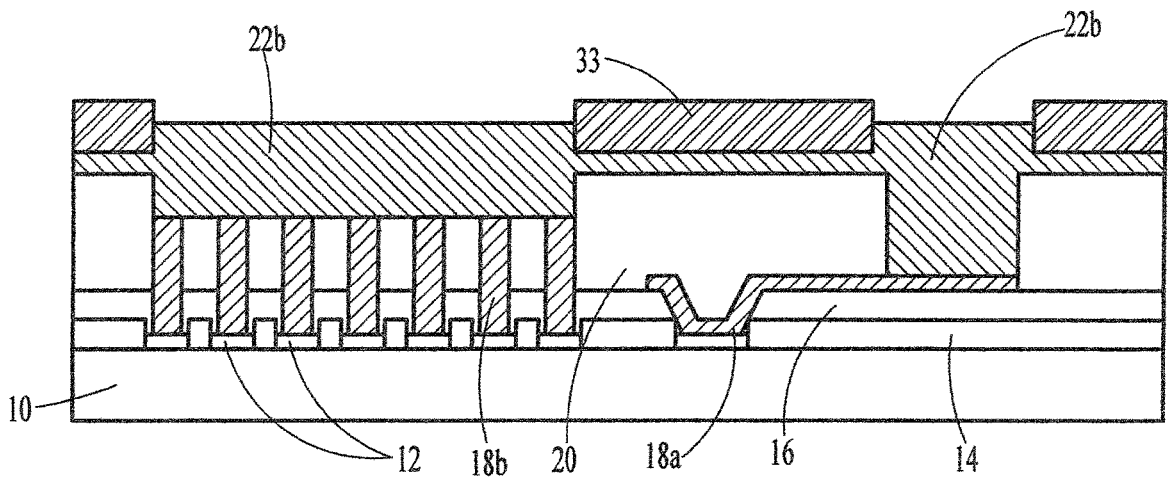

PR4 31 is stripped and a new mask PR5 33 is formed having openings where both high and low current carrying pins are to be formed. Thick uniform metal for UPM and UBM 22b is plated in a thick uniform process in the openings, as shown in FIG. 7I. The plating material may be Copper or any other plating metal.

Figure 7J:
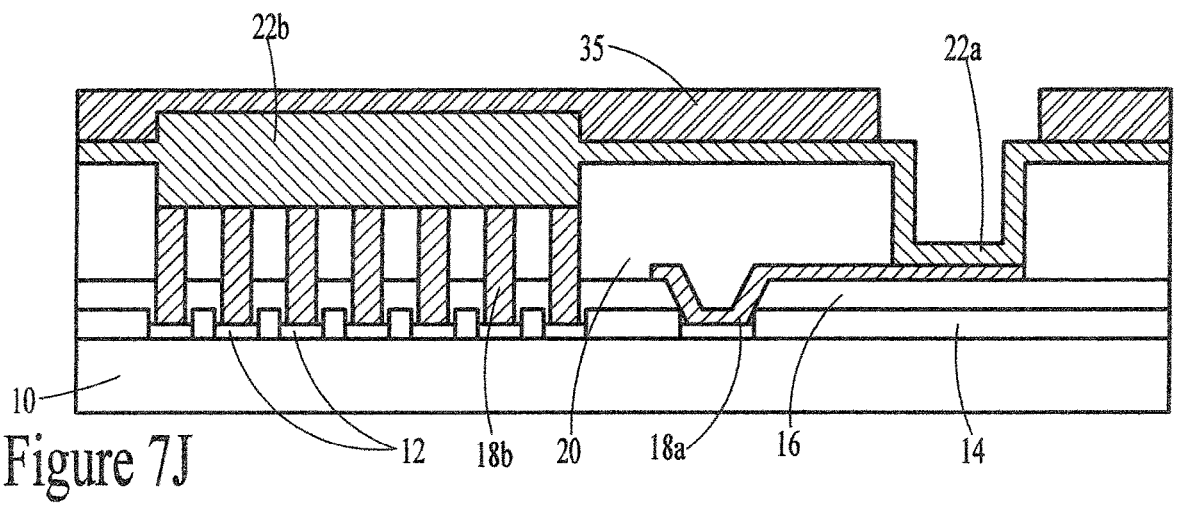

The PR5 33 is stripped and another mask PR6 35 is formed with an opening only over the low current areas. The UPM layer 22b is etched back, as shown in FIG. 7J to reduce the UPM for the low current pin for a total seed plus plating thickness 22a of >=8 µm and <=25 µm.

Figure 7K:
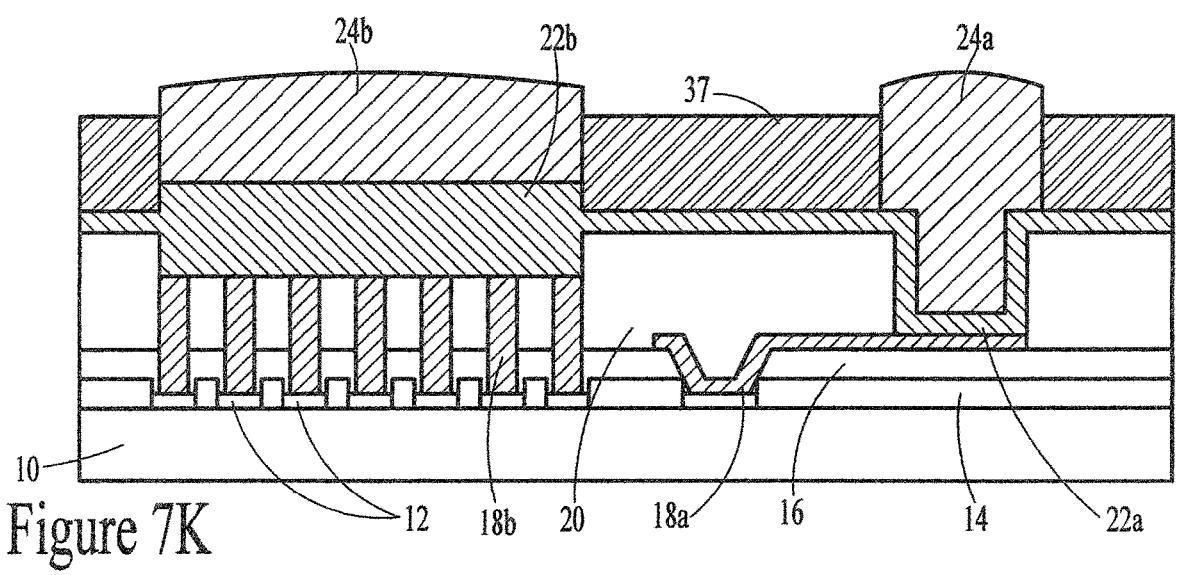

PR6 35 is stripped and new mask PR7 37 is formed on seed layer 22 with openings where the pins are to be formed. As shown in FIG. 7K, solder is plated on the UPM and UBM material exposed by the mask 37. It is important that both the solder pillar 24a and solder block 24b are plated to the same final level so that both end up in the same horizontal plane.

Figure 7L:
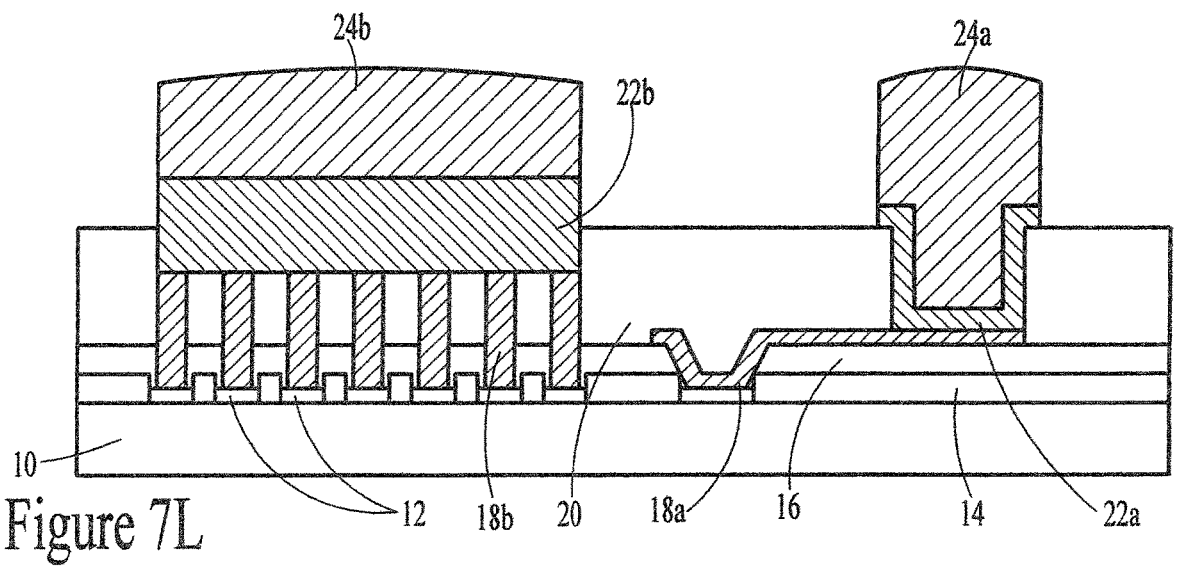

Finally, the PR7 37 is removed and the metal 22 not covered by the solder is etched away to complete the package, as shown in FIG. 7L.

The multi-pin WLCSP of the present disclosure provides better thermal, electrical, mechanical, and board level performance than the traditional wafer level chip scale packaging. This package supports higher current coming from analog blocks and has better quality package life when supporting high DC current for a longer time as compared to the WLCSP. The MP-WLCSP exhibits better electrical performance without having to violate any of the package design rules. Process flow, form factor, and assembly processing cost are similar to the traditional WLCSP.

Several alternatives or modifications may be made to the MP-WLCSP of the disclosure.

Figure 12:
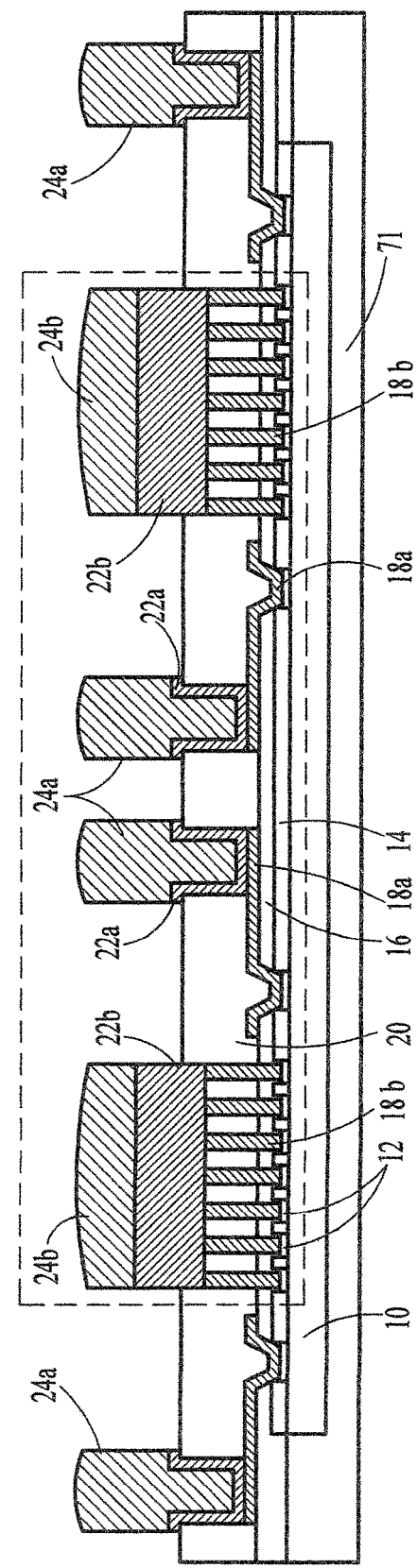
FIG. 12 is a cross-sectional representation of a first alternative embodiment of the present disclosure.

FIG. 12 illustrates a fan out wafer level chip scale package. The die is further encapsulated in a mold 71. The fan out WLCSP of the present disclosure uses the solder blocks and pillars as in the standard MP-WLCSP of the present disclosure.

Figure 13:
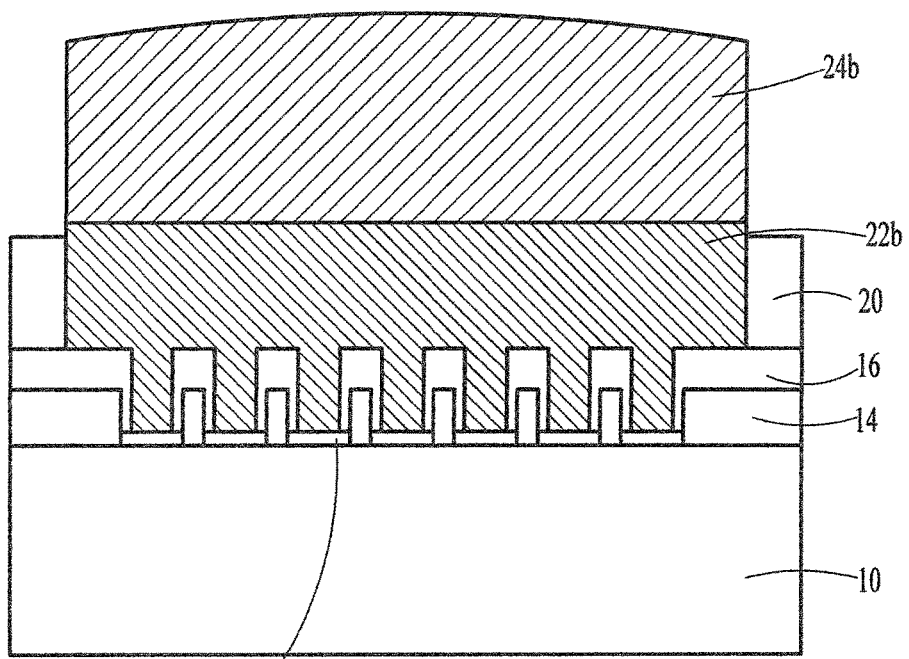
FIG. 13 is a cross-sectional representation of a second alternative embodiment of the present disclosure.

FIG. 13 illustrates a second modification where no RDL vias are used for the high current pins. In this alternative, the UBM 22b is formed within the vias directly on the first polymer layer 16. Advantages of this modification are fewer process steps, hence cost reduction and shorter manufacture cycle time.

Figure 14:
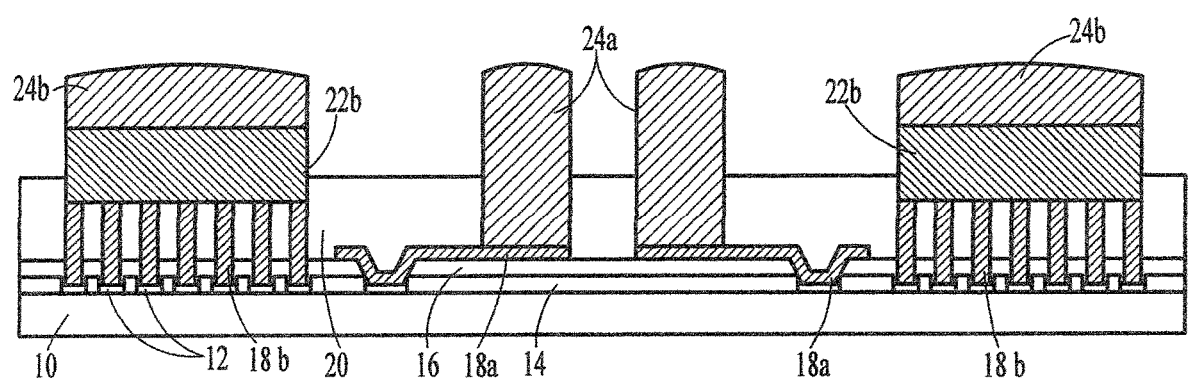
FIG. 14 is a cross-sectional representation of a third alternative embodiment of the present disclosure.

FIG. 14 illustrates a third modification where no UPM is used under the solder pillars 24a. The pillars are plated directly on the RDL traces 18a. Advantages of this modification are fewer process steps, hence cost reduction and shorter manufacture cycle time.

Figure 15:
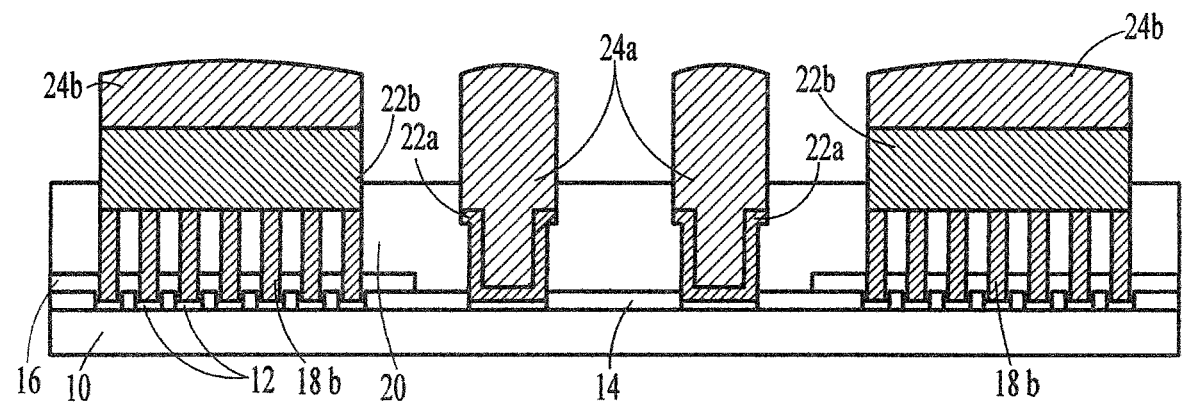
FIG. 15 is a cross-sectional representation of a fourth alternative embodiment of the present disclosure.

FIG. 15 illustrates a fourth modification where no RDL is used under the solder pillars 24a. The UPM traces 22a directly contact the silicon pads 12. Advantages of this modification are fewer process steps, hence cost reduction and shorter manufacture cycle time.

Figure 16:
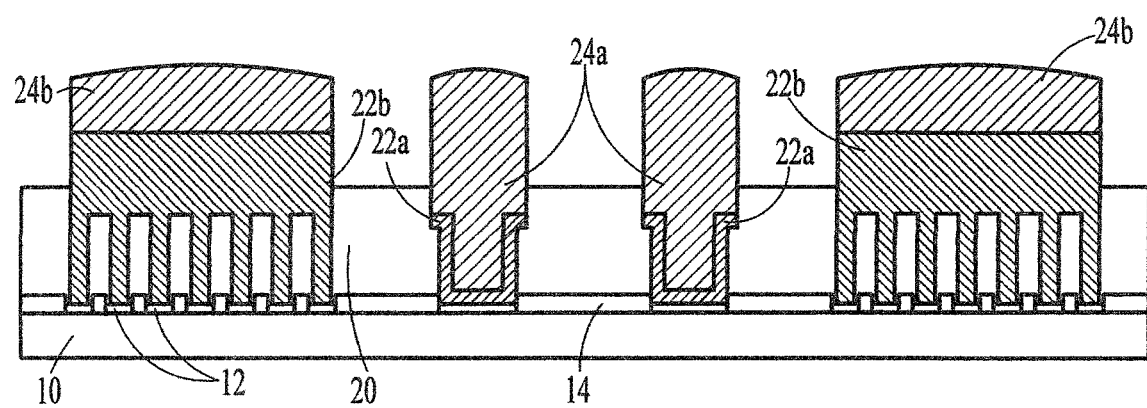
FIG. 16 is a cross-sectional representation of a fifth alternative embodiment of the present disclosure.

FIG. 16 illustrates a fifth modification where only one polymer layer 20 is used. Since there is only one polymer layer, there is also no RDL/RDL_VIA layer. Advantages of this modification are fewer process steps, hence cost reduction and shorter manufacture cycle time.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method of fabricating a multi-pin wafer level chip scale package comprising:

providing a silicon wafer having a passivation layer thereon having openings therein to silicon pads on said silicon wafer;

coating a first polymer layer on said passivation layer; and forming one or more metal traces contacting said silicon pads through openings in said first polymer layer in areas where low current connections are to be made and forming one or more metal blocks over and through vias contacting said silicon pads through openings in said first polymer layer in areas where high current connections are to be made, said forming said metal traces and said metal blocks comprising:

patterning said first polymer layer to form first openings to said silicon pads in said low current connection areas and to form vias to said silicon pads in said high current connection areas;

sputtering a redistribution layer (RDL) seed layer over said first polymer layer and in said first openings and vias;

plating a RDL layer on said RDL seed layer in said low current connection areas;

etching said RDL layer in said low current connection areas to form RDL traces;

thereafter forming RDL_VIAS in said high current connection areas;

thereafter depositing a second polymer layer over said RDL traces and RDL_VIAs and patterning said second polymer layer to provide second openings to said RDL_VIAs and to said RDL traces;

sputtering an under pillar metal (UPM) seed layer on said second polymer layer and within said second openings;

plating a UPM layer on said UPM seed layer in said low current areas wherein said UPM layer and said RDL traces together form said metal traces; and plating solder pillars on and above said metal traces;

thereafter etching away said UPM layer not covered by said solder pillars;

thereafter sputtering an under block metal (UBM) seed layer within said second openings over said RDL_VIAs;

forming a UBM layer on said UBM seed layer in said high current connection areas wherein said RDL_VIA and said UBM layer together form said metal blocks; and plating solder blocks on and above said metal blocks wherein said solder blocks are thicker and wider than said solder pillars and wherein a top surface of each of said solder pillars and solder blocks are in the same horizontal plane to complete said multi-pin wafer level chip scale package.

2. The method according to claim 1 wherein in said areas where high current connections are to be made said solder blocks can conduct currents of greater than 2 A and wherein in areas where low current connections are to be made said solder pillars can conduct currents equal to or lower than 2 A.

3. The method according to claim 1 wherein said forming RDL_VIAS in said high current connection areas comprises:

sputtering a RDL_VIA seed layer into said vias;

thereafter plating a RDL_VIA layer into and above said vias; and etching said RDL_VIA layer to form RDL_VIAS in said high current connection areas; and' wherein said forming said UBM layer comprises:

plating a UBM layer on said UBM seed layer in said high current connection areas wherein said RDL_VIA and said UBM layer together form said metal blocks; and after said plating said metal blocks, thereafter etching away said UBM layer not covered by said solder blocks.

4. The method according to claim 1 wherein said forming said RDL_VIAS in said high current connection areas comprises:

etching away said RDL seed layer in said vias;

thereafter sputtering a RDL_VIA seed layer in said vias;

thereafter placing a RDL_VIA strip in said vias and etching away said RDL_VIA seed layer not covered by said RDL_VIA strip; and' wherein said forming said UBM layer comprises:

placing a UBM strip on said RDL_VIA strip wherein said RDL_VIA strip in said vias and said UBM strip over said RDL strip in said vias form said metal blocks; and after said plating said metal blocks, thereafter sawing and trimming away excess RDL_VIA and UBM strip material.

5. The method according to claim 1 further comprising:

after said sputtering said redistribution layer (RDL) seed layer over said first polymer layer and in said first openings and vias, etching back said RDL seed layer in said low current connection areas to reduce RDL seed layer thickness;

after said sputtering said metal seed layer on said second polymer layer and within said second openings, etching back said metal seed layer in said low current connection areas to reduce metal seed layer thickness; and after plating said UPM layer on said metal seed layer in said low current connection areas, etching back said UPM layer in said low current connection areas to form UPM traces and to reduce UPM thickness.

6. The method according to claim 1 wherein said solder blocks and solder pillars are formed in a fan out wafer level chip scale package.

7. The method according to claim 1 wherein said solder pillars have a height of at least 120 μm and wherein said solder blocks have a height of at least 100 μm and wherein said metal traces have a thickness of >=4 μm and <=25 μm and wherein said metal blocks have a thickness of >=25 μm and <=50 μm.

8. A method of fabricating a multi-pin wafer level chip scale package comprising:

providing a silicon wafer having a passivation layer thereon having openings therein to silicon pads on said silicon wafer;

coating a first polymer layer on said passivation layer; and forming one or more metal traces contacting said silicon pads through openings in said first polymer layer in areas where low current connections are to be made and forming one or more metal blocks over and through vias contacting said silicon pads through openings in said first polymer layer in areas where high current connections are to be made, said forming said metal traces and said metal blocks comprising:

patterning said first polymer layer to form first openings to said silicon pads in said low current connection areas and to form vias to said silicon pads in said high current connection areas;

sputtering a redistribution layer (RDL) seed layer over said first polymer layer and in said first openings and vias;

plating a RDL layer on said RDL seed layer in said low current connection areas;

etching said RDL layer in said low current connection areas to form RDL traces;

thereafter forming RDL_VIAS in said high current connection areas;

thereafter depositing a second polymer layer over said RDL traces and patterning said second polymer layer to provide second openings to said RDL_VIAs and to said RDL traces;

plating solder pillars on and above said RDL traces;

thereafter sputtering an under block metal (UBM) seed layer within said second openings over said RDL_VIAs;

forming a UBM layer on said UBM seed layer in said high current connection areas wherein said RDL_VIA and said UBM layer together form said metal blocks; and plating solder blocks on and above said metal blocks wherein said solder blocks are thicker and wider than said solder pillars and wherein a top surface of each of said solder pillars and solder blocks are in the same horizontal plane to complete said multi-pin wafer level chip scale package.

9. The method according to claim 8 wherein said forming RDL_VIAS in said high current connection areas comprises:
sputtering a RDL_VIA seed layer into said vias;
thereafter plating a RDL_VIA layer into and above said vias; and
etching said RDL_VIA layer to form RDL_VIAS in said high current connection areas; and'
wherein said forming said UBM layer comprises:
plating a UBM layer on said UBM seed layer in said high current connection areas wherein said RDL_VIA and said UBM layer together form said metal blocks; and
after said plating said metal blocks, thereafter etching away said UBM layer not covered by said solder blocks.

10. The method according to claim 8 wherein said forming said RDL_VIAS in said high current connection areas comprises:
etching away said RDL seed layer in said vias;
thereafter sputtering a RDL_VIA seed layer in said vias;
thereafter placing a RDL_VIA strip in said vias and etching away said RDL_VIA seed layer not covered by said RDL_VIA strip; and'
wherein said forming said UBM layer comprises:
placing a UBM strip on said RDL_VIA strip wherein said RDL_VIA strip in said vias and said UBM strip over said RDL strip in said vias form said metal blocks; and
after said plating said metal blocks, thereafter sawing and trimming away excess RDL_VIA and UBM strip material.

11. The method according to claim 8 wherein said solder blocks and solder pillars are formed in a fan out wafer level chip scale package.

12. The method according to claim 8 wherein said solder pillars have a height of at least 120 μm and wherein said solder blocks have a height of at least 100 μm.

13. The method according to claim 8 wherein said metal traces have a thickness of >=4 μm and <=25 μm and wherein said metal blocks have a thickness of >=25 μm and <=50 μm.

14. A method of fabricating a multi-pin wafer level chip scale package comprising:
providing a silicon wafer having a passivation layer thereon having openings therein to silicon pads on said silicon wafer;
coating a first polymer layer on said passivation layer; and
forming one or more metal traces contacting said silicon pads through openings in said first polymer layer in areas where low current connections are to be made and forming one or more metal blocks over and through vias contacting said silicon pads through openings in said first polymer layer in areas where high current connections are to be made, said forming said metal traces and said metal blocks comprising:
patterning said first polymer layer to form first openings to said silicon pads in said low current connection areas and to form vias to said silicon pads in said high current connection areas;
sputtering an under pillar metal (UPM) seed layer on said first polymer layer and within said first openings;
plating a UPM layer on said UPM seed layer in said low current areas wherein said UPM layer forms said metal traces;
plating solder pillars on and above said metal traces;
thereafter etching away said UPM layer not covered by said solder pillars;
thereafter sputtering an under block metal (UBM) seed layer within said vias;
forming a UBM layer on said UBM seed layer in said high current connection areas wherein UBM layer forms said metal blocks; and
plating solder blocks on and above said metal blocks wherein said solder blocks are thicker and wider than said solder pillars and wherein a top surface of each of said solder pillars and solder blocks are in the same horizontal plane to complete said multi-pin wafer level chip scale package.

15. The method according to claim 14 further comprising:
sputtering a redistribution layer (RDL) seed layer over said first polymer layer and in said first openings;
plating a RDL layer on said RDL seed layer in said low current connection areas;
etching said RDL layer in said low current connection areas to form RDL traces; and
thereafter depositing a second polymer layer over said RDL traces and patterning said second polymer layer to provide second openings to said vias and to said RDL traces; and sputtering said UPM seed layer on said second polymer layer and within said second openings and said vias wherein said RDL traces and said UPM layer together form said metal traces.

16. The method according to claim 14 further comprising:
forming RDL_VIAS in said high current connection areas;
thereafter depositing a second polymer layer over said RDL_VIAs and patterning said second polymer layer to provide second openings to said RDL_VIAs and to said first openings; and
thereafter sputtering said under pillar metal (UPM) seed layer on said second polymer layer and within said second openings and sputtering an said under block metal (UBM) seed layer over said RDL_VIAs wherein said RDL_VIAs and said UBM layer together form said metal blocks.

17. The method according to claim 16 wherein said forming RDL_VIAS in said high current connection areas comprises:
sputtering a RDL_VIA seed layer into said vias;
thereafter plating a RDL_VIA layer into and above said vias; and
etching said RDL_VIA layer to form RDL_VIAS in said high current connection areas; and' wherein said forming said UBM layer comprises:
  plating a UBM layer on said UBM seed layer in said high current connection areas wherein said RDL_VIA and said UBM layer together form said metal blocks; and
  after said plating said metal blocks, thereafter etching away said UBM layer not covered by said solder blocks.

18. The method according to claim 16 wherein said forming said RDL_VIAS in said high current connection areas comprises:
  etching away said RDL seed layer in said vias;
  thereafter sputtering a RDL_VIA seed layer in said vias;
  thereafter placing a RDL_VIA strip in said vias and etching away said RDL_VIA seed layer not covered by said RDL_VIA strip; and'
wherein said forming said UBM layer comprises:
  placing a UBM strip on said RDL_VIA strip wherein said RDL_VIA strip in said vias and said UBM strip over said RDL strip in said vias form said metal blocks; and
  after said plating said metal blocks, thereafter sawing and trimming away excess RDL_VIA and UBM strip material.

19. The method according to claim 14 wherein said solder blocks and solder pillars are formed in a fan out wafer level chip scale package.

20. The method according to claim 14 wherein said solder pillars have a height of at least 120 μm and wherein said solder blocks have a height of at least 100 μm and wherein said metal traces have a thickness of $>=4$ μm and $<=25$ μm and wherein said metal blocks have a thickness of $>=25$ μm and $<=50$ μm.

* * * * *